(12) United States Patent
Oshima

(10) Patent No.: US 7,141,353 B2
(45) Date of Patent: Nov. 28, 2006

(54) PHOTOPOLYMERIZABLE PRESENSITIZED PLATE FOR USE IN MAKING LITHOGRAPHIC PRINTING PLATE AND METHOD FOR MAKING LITHOGRAPHIC PRINTING PLATE

(75) Inventor: Yasuhito Oshima, Haibara-Gun (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/386,427

(22) Filed: Mar. 13, 2003

(65) Prior Publication Data

US 2003/0211420 A1 Nov. 13, 2003

(30) Foreign Application Priority Data

Mar. 13, 2002 (JP) ............................. 2002-068811

(51) Int. Cl.
*G03F 7/035* (2006.01)
(52) U.S. Cl. .............................. 430/281.1; 430/284.1; 430/286.1; 430/302; 430/309; 430/435
(58) Field of Classification Search ............. 430/270.1, 430/278.1, 281.1, 284.1, 286.1, 287.1, 288.1, 430/302, 309, 434, 435, 494, 945
See application file for complete search history.

(56) References Cited

U.S. PATENT DOCUMENTS 3,615,480 A * 10/1971 Lam ........................... 430/331
4,877,711 A    10/1989 Aoai et al.
5,658,708 A *  8/1997 Kondo ...................... 430/288.1
6,475,700 B1* 11/2002 Higashi et al. ........... 430/278.1
6,638,687 B1* 10/2003 Higashi et al. ............. 430/302
6,641,980 B1* 11/2003 Nagase et al. .............. 430/302
6,727,044 B1*  4/2004 Fujimaki et al. ......... 430/284.1

FOREIGN PATENT DOCUMENTS

| EP | 0 949 540 A1 | 10/1999 |
| JP | 11-65129 A | 3/1999 |
| JP | 1 136 255 A2 * | 9/2001 |

* cited by examiner

*Primary Examiner*—Barbara L. Gilliam
(74) *Attorney, Agent, or Firm*—Sughrue Mion, PLLC

(57) ABSTRACT

The present invention provides a PS plate for use in making a lithographic printing plate, comprising an aluminum substrate provided thereon with a light-sensitive layer comprising a polyurethane resin binder, an addition polymerizable ethylenically unsaturated bond-containing compound and a photopolymerization initiator, wherein the polyurethane resin binder is one synthesized from at least the following compounds (i) to (iv): (i) at least one di-isocyanate compound; (ii) at least one diol compound having at least one carboxyl group; (iii) at least one diol compound whose log P value is less than 0; and (iv) at least one diol compound whose log P value is higher than 0. The PS plate and a method for making a lithographic printing plate therefrom according to the present invention satisfy the requirements for high resistance to staining and high printing durability, which permits the dissolution, in a developer, of the foregoing compounds insoluble in the developer or the stable dispersion of the compounds in the developer over a long period of time and improve the stable processing ability of the developer, without impairing the image-forming ability at all.

13 Claims, 4 Drawing Sheets

A : Light-Sensitive Layer Less Susceptible to Developer-Penetration
B : Light-Sensitive Layer Susceptible to Developer-Penetration
$t_A$ : Time Elapsed Till the Electrostatic Capacity Undergoes a Change
$t_B$ : Time Elapsed Till the Electrostatic Capacity Undergoes a Change In Case of the Invention time → (There is observed interference waves.)

In Case of the Conventional Technique time → (There is not observed any interference waves.)

PHOTOPOLYMERIZABLE PRESENSITIZED PLATE FOR USE IN MAKING LITHOGRAPHIC PRINTING PLATE AND METHOD FOR MAKING LITHOGRAPHIC PRINTING PLATE

FIELD OF THE INVENTION

The present invention relates to a presensitized plate (hereinafter, referred to as PS plate) for use in making a lithographic printing plate as well as a method for making the lithographic printing plate. More specifically, the present invention pertains to a photopolymerizable light-sensitive lithographic printing plate whose developing characteristics are never reduced or deteriorated by the elapse of a long period of time and/or repeated use thereof, whose non-image areas (un-exposed areas) has a good developing ability, in which the resulting non-image area of the lithographic printing plate has excellent resistance to staining during printing operations, whose image areas (exposed areas) are highly resistant to the development and which can thus form quite firm images and which can provide a lithographic printing plate having high printing durability as well as a method for making such a lithographic printing plate.

BACKGROUND OF THE INVENTION

The developers, which have conventionally widely been used for developing a photopolymerizable PS plate for use in making lithographic printing plate, can roughly be divided into the following three groups a) to c): a) a non-aqueous developer mainly comprising an organic solvent; b) an aqueous developer mainly comprising an inorganic alkali; and c) an aqueous developer mainly comprising an organic base.

Among them, there have recently been used the aqueous developers b) and c) because of the requirements for the environmental protection.

The characteristic properties of these two kinds of developers will be detailed below. The inorganic alkali-containing developer b) is characterized in that it in general comprises a silicate at a pH value in the proximity to 12 for the purpose of the hydrophilization of the surface of the substrate after the completion of the development.

This silicate is an essential component used in the hydrophilization treatment for preventing any staining of the non-image area of the lithographic printing plate during printing operations.

For instance, there have been known a developer having a pH value of not less than 12 such as those disclosed in Japanese Un-Examined Patent Publication (hereunder referred to as "J.P. KOKAI") Hei 8-248643 and a developer having a pH value of not more than 12 such as those disclosed in J.P. KOKAI Hei 11-65129. The former developer having a pH value of not less than 12 may easily dissolve aluminum commonly used as a material for a substrate. In particular, in case of a point having a small image area (a dot), there is observed such a phenomenon that the aluminum substrate just under the dot image is dissolved due to the side etching phenomenon and such dot is eliminated from the substrate during printing operations (skipping over of dots). In other words, the developer suffers from a problem such that it may significantly deteriorate the printing durability of the resulting lithographic printing plate.

In addition, the latter developer having a pH value of not more than 12 is excellent in the foregoing printing durability and resistance to staining during printing, but the developer suffers from a new problem such that if the developing treatment using the developer is continued over a long period of time, the pH value of the developer is liable to be reduced due to, for instance, the action of carbon dioxide present in the air and the silicate is separated out from the developer and this makes the developing treatment unstable.

Moreover, there have also been proposed developers free of any silicate and examples thereof are disclosed in, for instance, J.P. KOKAI Nos. Sho 61-109052, 2000-81711 and Hei 11-65126 and German Patent No. 1,984,605. However, these developers free of any silicate are inferior in the resistance to staining during printing as compared with the silicate-containing developers and it is difficult for the developers to simultaneously satisfy the requirements for the resistance to staining during printing and the printing durability.

On the other hand, there have been known, as the organic base-containing developer c), those comprising an organic amine such as ethanolamine and an alcoholic organic solvent such as benzyl alcohol as an auxiliary developing agent. In this case, the pH value thereof is certainly low on the order of about 10 and therefore, these developers are not adversely affected by carbon dioxide and thus ensure stable processing of exposed PS plates. However, these developers are disadvantageous in the hydrophilization of the substrate, while their ability of penetrating into the image areas is too strong, in particular, they adversely affect dot images and the dot images are removed from the substrate during development or they suffer from a problem of deteriorating the image-forming ability of the PS plate for making lithographic printing plates.

In other words, there has not yet been developed any satisfactory developer, while taking into consideration the problems concerning, for instance, the image-forming ability, staining of the printing plate during printing operations and printing durability and the ability of stable processing or development in case of the photopolymerizable lithographic printing plate.

Moreover, it has been recognized that the development is greatly influenced by the developer composition and more specifically by, for instance, the presence of a silicate, the height of the pH value and the difference between the inorganic and organic alkaline agents, but the conventional combinations have never solved the foregoing problems.

Furthermore, when the photopolymerizable light-sensitive lithographic printing plate is continuously developed over a long period of time, impurities are accumulated, coagulated and precipitated in a developer used to thus generate scum formed during development (developing scum) and this in turn becomes a cause of making the development unstable.

The components of such developing scum have not yet been clearly elucidated, but it has been found, as a result of analysis, that the majority of the components are components contained in the light-sensitive layer and insoluble in the developer.

Examples of such components insoluble in the developer are various kinds of coloring agents added to the light-sensitive layer for the discrimination of light-exposed areas from un-exposed areas. As such coloring agents, there have been used, in the photopolymerizable light-sensitive layer, so-called pigments, which are not molecularly dispersed in the light-sensitive layer, but are dispersed therein in the form of aggregates, while maintaining the crystalline condition, for the purpose of preventing any desensitization due to radical-trapping and/or that due to unnecessary interaction (such as energy transfer and electron transfer) with initiator systems (such as initiators per se or combinations of sensitizing dyes with initiators). However, such pigments are essentially insoluble in the developer. Accordingly, they are initially temporarily dispersed in a developer in the developing process for removing un-exposed areas, but they are accumulated, coagulated and precipitated in the developer to thus generate developing scum, if the developing treatment is continued over a long period of time.

In addition, the photopolymerizable lithographic printing plate comprises a variety of photopolymerization initiators (radical generators) for coping with the laser light sources recently developed and there have been known, in particular, titanocene type initiators, which are sensitive to laser light beams and excellent in both stability and sensitivity. However, the titanocene type initiator is an organometal, insoluble in developers like the foregoing coloring agents or pigments. Accordingly, they are initially temporarily dispersed in a developer, but they are likewise accumulated, coagulated and precipitated in the developer to thus generate developing scum, if the developing treatment is continued over a long period of time.

It is thus quite important to solve the problem of such developing scum in addition to the solution of the foregoing problem of the silicate-precipitation associated with the reduction of the pH value in order to ensure the ability of stable processing or development.

On the other hand, as a means for improving the printing durability of a printing plate, there has been proposed the use of urethane polymer, as a binder having high strength, such as those disclosed in, for instance, J.P. KOKAI Nos. Hei 3-287165 and Hei 4-204453. However, either of them could not satisfactorily show its function if it is used in combination with the foregoing developer or they could not provide any printing plate having satisfactory printing durability.

As has been described above in detail, there has been desired for the development of a presensitized plate for use in making lithographic printing plates, which can satisfy the requirements for the image-forming ability, the simultaneous achievement of high resistance to staining and printing durability of the resulting printing plate and the stable processing ability as well as a method for making a lithographic printing plate.

SUMMARY OF THE INVENTION

Accordingly, it is an object of the present invention to provide a lithographic printing plate, which can eliminate the drawbacks associated with the foregoing conventional techniques, which can simultaneously satisfy the requirements for high resistance to staining and high printing durability, which permits the dissolution, in a developer, of the foregoing compounds insoluble in the developer or the stable dispersion of the compounds in the developer over a long period of time and which can improve the stable processing ability of the developer, without impairing the image-forming ability at all as well as a method for making such a lithographic printing plate.

The inventors of this invention have conducted various investigations and as a result, have succeeded in the achievement of the foregoing object, while making use of the technique having the following construction. According to the present invention, there is provided a presensitized plate for use in making a lithographic printing plate, which comprises an aluminum substrate provided thereon with a light-sensitive layer comprising a polyurethane resin binder, an addition polymerizable ethylenically unsaturated bond-containing compound and a photopolymerization initiator, wherein the polyurethane resin binder is one synthesized from at least the following compounds (i), (ii), (iii) and (iv):

(i) at least one di-isocyanate compound;
(ii) at least one diol compound having at least one carboxyl group;
(iii) at least one diol compound whose log P value is less than 0 wherein said log P value is defined as a logarithmic value of balanced concentration ratio P calculated from a proportion of partition between octanol layer and water layer; and
(iv) at least one diol compound whose log P value is higher than 0, provided that the compounds (iii) and (iv) do not include diol compounds each having a carboxyl group.

According to the present invention, there is also provided a method for making a lithographic printing plate comprising the steps of imagewise exposing the foregoing PS plate for making a lithographic printing plate to a laser beam and then developing the imagewise exposed PS plate with a developer, which comprise a nonionic compound represented by the following general formula (I) and which has a pH value ranging from 11.5 to 12.8 and an electrical conductivity ranging from 3 to 30 mS/cm:

$$A-W \quad (I)$$

wherein, A represents a hydrophobic organic group derived from A–H whose log P is not less than 1.5 and W represents a nonionic hydrophilic organic group derived from W–H whose log P is less than 1.0).

As preferred embodiments of the present invention, specific examples of the nonionic compounds represented by the foregoing general formula (I) and preferably used herein are at least one member selected from the group consisting of nonionic aromatic ether type active compounds represented by

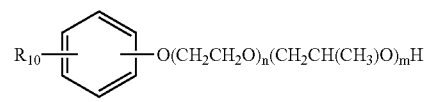

(I-A)

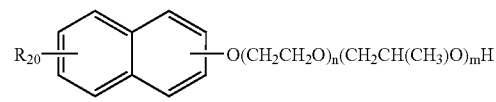

(I-B)

the following formulas (I-A) and (I-B):

wherein, $R_{10}$, $R_{20}$ each represents H or a hydrocarbon group having 1 to 100 carbon atoms and n, m each represents an integer ranging from 0 to 100, provided that n and m do not simultaneously represent 0.

As a preferred embodiment of the plate-making method of the present invention, the developer used in the foregoing method further comprises an alkali silicate in an amount ranging from 0.75 to 4.0 as expressed in terms of the molar ratio: $SiO_2/M_2O$ (M represents an alkali metal or ammonium residue).

As another preferred embodiment of the plate-making method of the present invention, the development in the foregoing method is carried out in such a manner that the rate of the development of the un-exposed area is not less than 0.05 µm/s and the rate of the developer penetrating into the exposed area is not more than 0.1 µm/s.

As another preferred embodiment of the plate-making method of the present invention, the polyurethane resin binder used has an acid value ranging from 0.2 to 4.0 meq/g and the light-sensitive layer has an acid value of not more than 1.0 meq/g in the foregoing method.

As another preferred embodiment of the plate-making method of the present invention, the light-sensitive layer comprises at least one member selected from the group consisting of titanocene type initiators and coloring agents (pigments), in the foregoing method.

As has been discussed above, the present invention has succeeded in the simultaneous achievement of the requirements for high resistance to staining and high printing durability, permitted the dissolution, in a developer, of the foregoing compounds insoluble in the developer or the stable dispersion of the compounds in the developer over a long period of time and also permitted the improvement of the stable processing ability of the developer, without impairing the image-forming ability at all, by the use of a developer comprising specific components and the use of a specific polyurethane resin binder in the light-sensitive layer.

The specific developer is presently considered to be a developer composition satisfying the following requirements:

First, the developer should be able to quite favorably act on a presensitized plate for use in making a lithographic printing plate with respect to the image-forming ability (more specifically, the developer shows a strong ability of developing un-exposed areas, while it has a low ability of penetrating into exposed areas, the light-sensitive layer is dissolved in the developer without causing any swelling and it is dissolved therein, in order, from the surface thereof).

Secondly, the developer should permit the complete removal of the light-sensitive layer on the un-exposed area and it can regenerate the substrate surface as a hydrophilic surface, which never causes any staining during printing operations.

Thirdly, it should comprise the foregoing nonionic compound represented by the general formula (I), which can stably disperse or solubilize the foregoing compounds insoluble in the developer and which thus has a hydrophobic site capable of interacting with these insoluble compounds and a hydrophilic site for dispersing and stabilizing them in water.

Fourthly, the developer should comprise a chelating agent for the removal of divalent metals such as Ca ions included in water and serving as a primary factor of making the development processing unstable.

Among these, the first and second requirements for the developer are greatly influenced by the characteristic properties of the components included in the light-sensitive layer. In particular, the presence of a specific polyurethane resin binder in the light-sensitive layer of the photopolymerizable lithographic printing plate permits the achievement of a synergistic effect with the foregoing effect of the developer. Moreover, if the acid value of the light-sensitive layer is lower than that observed for the conventional light-sensitive layer, the foregoing effect becomes more conspicuous and therefore, the acid value thereof is considered to be important.

DETAILED DESCRIPTION OF THE INVENTION

Figure 1:
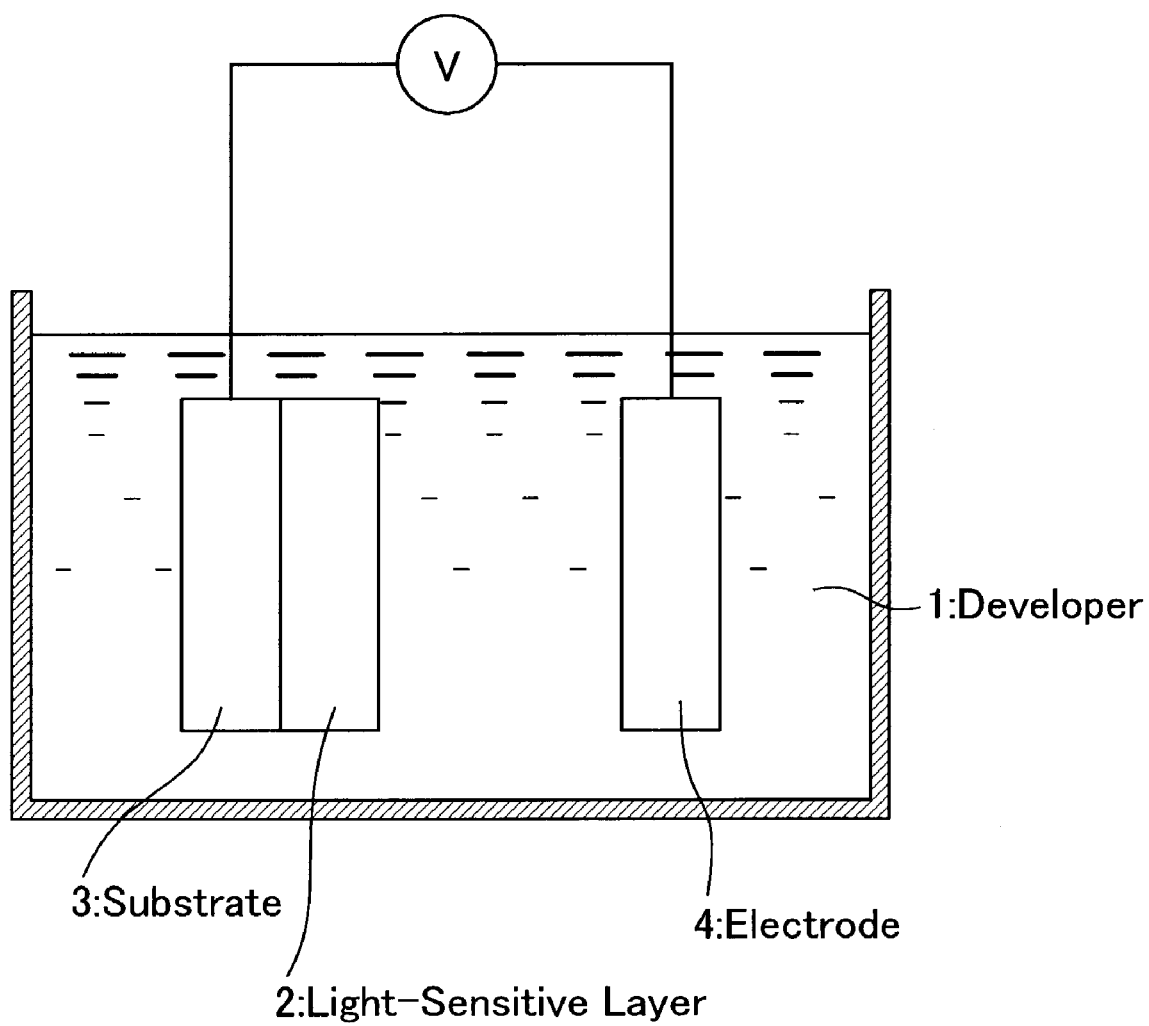
FIG. 1 shows schematically a device for determining a developer-penetration rate.

The method for making a lithographic printing plate according to the present invention will further be described in detail below.

First, the PS plate for use making a lithographic printing plate used in the present invention will be described below. The PS plate comprises an aluminum substrate provided thereon with a light-sensitive layer, which comprises a polyurethane resin binder, an addition polymerizable ethylenically unsaturated bond-containing compound and a photopolymerization initiator.

[Light-Sensitive Layer]

The light-sensitive layer of the PS plate for making a lithographic printing plate used in the present invention is a light-sensitive composition, which comprises a polyurethane resin binder, an addition polymerizable ethylenically unsaturated bond-containing compound and a photopolymerization initiator and which is applied onto the surface of an aluminum substrate.

Namely, the essential components of the light-sensitive layer used in the present invention are as follows:
(a) A polyurethane resin binder;
(b) An addition polymerizable ethylenically unsaturated bond-containing compound; and
(c) A photopolymerization initiator.

The light-sensitive layer may, if necessary, comprise a variety of compounds such as a coloring agent, a plasticizer and/or a heat polymerization inhibitor.

First, the polyurethane resin binder (a) used in the present invention will be detailed below.

The polyurethane resin binder as an essential component of the light-sensitive layer of the present invention is one synthesized from at least the following compounds (i), (ii), (iii) and (iv). Such a polyurethane resin binder has a polyurethane structure comprising at least the following compounds:
(i) At least one di-isocyanate compound;
(ii) At least one diol compound having at least one carboxyl group;
(iii) At least one diol compound whose log P value is less than 0, wherein said log P value is defined as a logarithmic value of balanced concentration ratio P calculated from a proportion of partition between octanol layer and water layer; and
(iv) At least one diol compound whose log P value is higher than 0, provided that the compounds (iii) and (iv) do not include diol compounds each having a carboxyl group.

The use of such a resin binder would permit the inhibition of any damage of the exposed area during development and the impartment of both good resistance to staining and high printing durability to the resulting lithographic printing plate, without reducing the developing ability of the un-exposed area even when the acid value of the light-sensitive layer is low.

(i) Di-Isocyanate Compound

Examples of di-isocyanate compounds usable herein are those represented by the following general formula (1):

OCN-L-NCO  (1)

wherein, L represents a divalent aliphatic or aromatic hydrocarbon group. If necessary, L may have other functional groups, which never react with isocyanate groups, such as carbonyl, ester, urethane, amide and/or ureide groups.

More specifically, L represents a single bond or a divalent aliphatic or aromatic hydrocarbon group, which may have a substituent (preferably used herein include, for instance, alkyl, aralkyl, aryl, alkoxy and/or halogeno groups), preferably an alkylene group having 1 to 20 carbon atoms or an arylene group having 6 to 15 carbon atoms and more preferably an alkylene group having 1 to 8 carbon atoms. Moreover, L may if needed comprise other functional groups, which never react with isocyanate groups, such as carbonyl, ester, urethane, amide, ureide and/or ether groups.

Specific examples of di-isocyanate compounds are aromatic di-isocyanate compounds such as 2,4-tolylene di-isocyanate, dimmer of 2,4-tolylene di-isocyanate, 2,6-tolylene di-isocyanate, p-xylylene di-isocyanate, m-xylylene di-isocyanate, 4,4'-diphenyl-methane di-isocyanate, 1,5-naphthylene di-isocyanate and 3,3'-dimethylbiphenyl-4,4'-di-isocyanate; aliphatic di-isocyanate compounds such as hexamethylene di-isocyanate, trimethyl-hexamethylene di-isocyanate, lysine di-isocyanate and dimeric acid di-isocyanate; alicyclic di-isocyanate compounds such as isophorone di-isocyanate, 4,4'-methylene-bis(cyclohexyl isocyanate), methyl cyclohexane-2,4 (or 2,6) di-isocyanate and 1,3-(isocyanate methyl) cyclohexane; and di-isocyanate compounds as reaction products of diols with di-isocyanates such as an addition product of one mole of 1,3-butylene glycol with 2 moles of tolylene di-isocyanate.

These di-isocyanate compounds may be used alone or in any combination of at least two of them. They are preferably used in combinations of at least two of them from the viewpoint of the balance between the printing durability and the resistance to staining of the resulting printing plate and, in particular, it is preferred to use a combination of at least one aromatic di-isocyanate compound (L represents an aromatic group) with at least one aliphatic di-isocyanate compound (L represents an aliphatic group).

The amount of the di-isocyanate to be used preferably ranges from 0.8 to 1.2 and more preferably 0.9 to 1.1 as expressed in terms of the molar ratio: di-isocyanate compound/diol compound. In case where the di-isocyanate compound is used in excess with respect to the diol compound and isocyanate groups remain at termini of the resulting polymer, the polymer should be treated with alcohols or amines after the completion of the reaction for converting di-isocyanate into urethane to thus finally eliminate any remaining isocyanate group from the urethane resin.

(ii) At Least One Diol Compound having at Least One Carboxyl Group

As at least one diol compound having at least one carboxyl group, there may be listed, for instance, diol compounds represented by the following general formulas (2), (3) and (4) and/or compounds obtained by cleaving tetra-carboxylic acid di-anhydrides with diol compounds. The diol compounds usable herein for cleaving the carboxylic acid di-anhydrides may be those represented by formula (iii) and formula (iv) as will be described later.

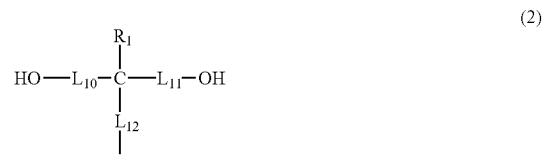

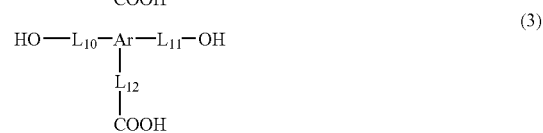

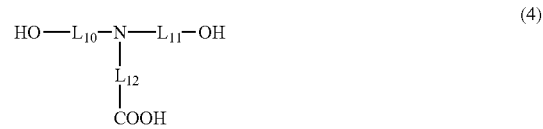

$R_1$ represents a hydrogen atom or an alkyl, aralkyl, aryl, alkoxy or aryloxy group, which may have a substituent (such as cyano, nitro, halogen atom (—F, —Cl, —Br, —I), —CONH$_2$, —COOR$_{113}$, —OR$_{113}$, —NHCONHR$_{113}$, —NHCOOR$_{113}$, —NHCOR$_{113}$, —OCONHR$_{113}$ (wherein R$_{113}$ represents an alkyl group having 1 to 10 carbon atoms or an aralkyl group having 7 to 15 carbon atoms), preferably a hydrogen atom, an alkyl group having 1 to 8 carbon atoms or an aryl group having 6 to 15 carbon atoms.

$L_{10}$, $L_{11}$, $L_{12}$ may be the same or different and each represents a single bond or a divalent aliphatic or aromatic hydrocarbon group, which may have a substituent (preferred examples thereof are alkyl, aralkyl, aryl, alkoxy and/or halogeno groups), preferably an alkylene group having 1 to 20 carbon atoms or an arylene group having 6 to 15 carbon atoms and more preferably an alkylene group having 1 to 8 carbon atoms. Moreover, $L_{10}$, $L_{11}$ and $L_{12}$ may, if needed, comprise other functional groups, which never react with isocyanate groups, such as carbonyl, ester, urethane, amide, ureide and/or ether groups. In this respect, two or three substituents out of $R_1$, $L_{10}$, $L_{11}$ and $L_{12}$ may form a ring.

Ar represents a trivalent aromatic hydrocarbon group, which may have a substituent, and preferably an aromatic group having 6 to 15 carbon atoms.

Specific examples of diol compounds having carboxyl groups and represented by the foregoing formula (2), (3) or (3) include those listed below: 3,5-dihydroxy benzoic acid, 2,2-bis(hydroxymethyl) propionic acid, 2,2-bis(2-hydroxyethyl) propionic acid, 2,2-bis(3-hydroxypropyl) propionic acid, bis(hydroxymethyl) acetic acid, bis(4-hydroxyphenyl) acetic acid, 2,2-bis(hydroxymethyl) acetic acid, 4,4-bis(4-hydroxy-phenyl) pentanoic acid, succinic acid, N,N-dihydroxy-ethyl glycine and N,N-bis(2-hydroxyethyl)-3-carboxy-propionamide.

Moreover, examples of tetra-carboxylic acid di-anhydrides preferably used for the preparation of at least one diol compound having at least one carboxyl group are those represented by the following general formulas (5), (6), (7):

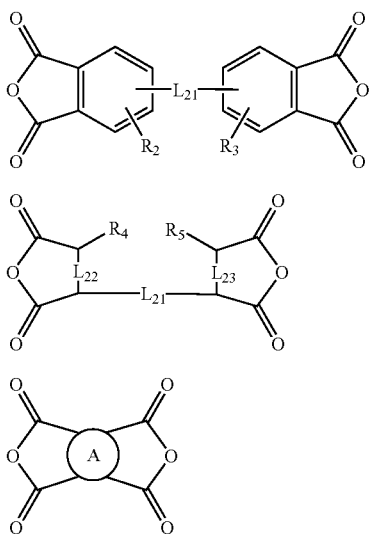

wherein, $L_{21}$ represents a single bond, a divalent aliphatic or aromatic hydrocarbon group, which may have a substituent (preferred examples thereof are alkyl, aralkyl, aryl, alkoxy, ester and amide groups or halogen atoms), —CO—, —SO—, —SO$_2$—, —O— or —S—. The substituent preferably represents a single bond, a divalent aliphatic hydrocarbon group having 1 to 15 carbon atoms, —CO—, —SO$_2$—, —O— or —S—. $R_2$, $R_3$ may be the same or different and each represents a hydrogen atom or an alkyl, aralkyl, aryl, alkoxy or halogeno group and preferably a hydrogen atom, an alkyl group having 1 to 8 carbon atoms, an aryl group having 6 to 15 carbon atoms, an alkoxy group having 1 to 8 carbon atoms or a halogeno group. In this respect, two out of $L_{21}$, $R_2$ and $R_3$ may be bonded together to form a ring. $R_4$, $R_5$ may be the same or different and each represents a hydrogen atom or an alkyl, aralkyl, aryl or halogeno group and preferably a hydrogen atom, an alkyl group having 1 to 8 carbon atoms or an aryl group having 6 to 15 carbon atoms. In this respect, two out of $L_{21}$, $R_4$ and $R_5$ may be bonded together to form a ring. $L_{22}$, $L_{23}$ may be the same or different and each represents a single bond, a double bond or a divalent aliphatic hydrocarbon group and preferably a single bond, a double bond or a methylene group. A represents a mononuclear or polynuclear aromatic ring and preferably an aromatic ring having 6 to 18 carbon atoms.

Specific examples of compounds represented by the general formula (5), (6) or (7) include those listed below:

Specific examples of the compounds include aromatic tetra-carboxylic acid dianhydrides such as pyromellitic acid dianhydride, 3,3',4,4'-benzophenone-tetra-carboxylic acid dianhydride, 3,3',4,4'-diphenyl-tetra-carboxylic acid dianhydride, 2,3,6,7-naphthalene-tetracarboxylic acid dianhydride, 1,4,5,8-naphthalene-tetra-carboxylic acid dianhydride, 4,4'-sulfonyl-diphthalic acid dianhydride, 2,2-bis(3,4-di-carboxy-phenyl) propane dianhydride, bis(3,4-dicarboxy-phenyl) ether dianhydride, 4,4'-[3,3'-(alkyl-phosphoryl-diphenylene)-bis(imino-carbonyl)] di-phthalic acid di-anhydride, adduct of hydroquinone di-acetate with trimellitic acid anhydride and adduct of diacetyldiamine with trimellitic acid anhydride; alicyclic tetracarboxylic acid dianhydrides such as 5-(2,5-dioxo-tetrahydrofuryl)-3-methyl-3-cyclohexene-1,2-dicarboxylic acid anhydride (EPICHLON B-4400 available from Dainippon Ink and Chemicals, Inc.), 1,2,3,4-cyclopentane-tetracarboxylic acid dianhydride, 1,2,4,5-cyclohexane-tetracarboxylic acid dianhydride, 1,2,4,5-cyclohexane-tetracarboxylic acid dianhydride and tetrahydrofuran-tetracarboxylic acid dianhydride; and aliphatic tetra-carboxylic acid dianhydrides such as 1,2,3,4-butane-tetracarboxylic acid dianhydride and 1,2,4,5-pentane-tetracarboxylic acid dianhydride.

The at least one kind of diol compound having at least one carboxyl group (ii) may be synthesized by ring-opening these tetracarboxylic acid dianhydrides with diol compounds. Alternatively, it is also possible to synthesize the polyurethane resin used in the present invention by first reacting a diol compound with a di-isocyanate compound (i) and then reacting the reaction product with the foregoing tetracarboxylic acid dianhydride and this method is likewise included in the scope of the present invention. In other words, the structural units derived from a tetracarboxylic acid dianhydride and a diol compound can be introduced into a polyurethane resin according to the following methods:

a) A method comprises the steps of cleaving a tetracarboxylic acid dianhydride with a diol compound to form a compound carrying a terminal alcohol group and then reacting the compound with a di-isocyanate compound.

b) A method comprises the steps of reacting a di-isocyanate compound with an excess diol compound to give a urethane compound carrying a terminal alcohol group and then reacting the urethane compound with a tetracarboxylic acid dianhydride.

Among the diol compounds each carrying at least one carboxyl group, those represented by the general formula (2) are preferably used herein because of their high solubility in solvents and easy preparation. Moreover, the at least one diol compound having at least one carboxyl group is introduced into the polyurethane resin binder in such an amount that the resulting polyurethane resin binder has carboxyl groups falling within the range of from 0.2 to 4.0 meq/g, preferably 0.3 to 3.0 meq/g, more preferably 0.4 to 2.0 meq/g, particularly preferably 0.5 to 1.5 meq/g and most preferably 0.6 to 1.2 meq/g. Accordingly, the content of the structure derived from the at least one diol compound having at least one carboxyl group (ii) in the resulting polyurethane resin binder may appropriately be selected depending on a variety of factors such as the number of carboxyl groups, the kinds of other diol components used, the acid value and molecular weight of the resulting polyurethane resin binder and the composition and pH value of the developer used, but the content ranges, for instance, from 5 to 45 mole %, preferably 10 to 40 mole % and more preferably 15 to 35 mole %.

(iii) At Least One Diol Compound whose log P Value is Less than 0

The term "log P" appearing in the definition of the diol compounds (iii) and (iv) has the meaning identical to that specified later in connection with the nonionic surfactant present in the developer and can likewise be calculated on the basis of the known data.

The diol compound usable herein, whose log P value is less than 0, is not restricted to any particular one, but the diol compound does not include those having a log P value of less than 0 and comprising a carboxyl group. As diol compounds whose log P value is less than 0, there may be listed, for instance, ethylene glycol compounds represented by the following general formula (A'):

  (A')

(wherein, n is an integer of not less than 1.)

Examples of such diol compounds also include random copolymers and block copolymers of ethylene oxides having terminal hydroxyl groups and propylene oxide, whose log P value is less than 0.

The diol compounds also usable herein include, for instance, ethylene oxide adducts of bisphenol A (the number of added ethylene oxide is not less than 27 and not more than 100), ethylene oxide adducts of bisphenol F (the number of added ethylene oxide is not less than 22 and not more than 100), ethylene oxide adducts of hydrogenated bisphenol A (the number of added ethylene oxide is not less than 23 and not more than 100) and ethylene oxide adducts of hydrogenated bisphenol F (the number of added ethylene oxide is not less than 18 and not more than 100). These diol compounds whose log P value is less than 0 may be used alone or in any combination of at least two of them, but they are preferably used separately from the viewpoint of the stability (in, for instance, sensitivity and printing durability) of the printing plate.

The diol compound whose log P value is less than 0 should have a log P value preferably ranging from −10 to −0.5, more preferably −8 to −1 and further preferably −5 to −1.2 from the viewpoint of the resistance to staining of the resulting printing plate. More specifically, preferably used herein are those selected from ethylene glycol compounds represented by Formula (A') from the viewpoint of the resistance to staining, more preferably ethylene glycol compounds of Formula (A') in which n ranges from 2 to 50, further preferably ethylene glycol compounds of Formula (A') in which n ranges from 3 to 30 and particularly preferably ethylene glycol compounds of Formula (A') in which n ranges from 4 to 10. The content of the at least one diol compound whose log P value is less than 0 in the polyurethane resin binder is appropriately be selected while taking into consideration a variety of factors such as the log P value of each specific diol compound selected, the kinds of other diol compounds used, the acid value and molecular weight of the resulting polyurethane resin binder and the composition and pH value of the developer used, but it preferably ranges from 1 to 45 mole %, more preferably 5 to 40 mole %, further preferably 10 to 35 mole % and particularly preferably 15 to 30 mole %.

(iv) At Least One Diol Compound whose log P Value is Greater than 0

The diol compounds whose log P value is greater than 0 are not restricted to specific compounds inasmuch as they have a log P value of greater than 0, provided that carboxyl group-containing diol compounds are excluded from the definition of the at least one diol compound whose log P value is greater than 0.

Specific examples of such diol compounds are 1,2-propylene glycol, di-1,2-propylene glycol, tri-1,2-propylene glycol, tetra-1,2-propylene glycol, hexa-1,2-propylene glycol, 1,3-propylene glycol, di-1,3-propylene glycol, tri-1,3-propylene glycol, tetra-1,3-propylene glycol, 1,3-butylene glycol, di-1,3-butylene glycol, tri-1,3-butylene glycol, hexa-1,3-butylene glycol, polypropylene glycol having an average molecular weight of 400, polypropylene glycol having an average molecular weight of 700, polypropylene glycol having an average molecular weight of 1000, polypropylene glycol having an average molecular weight of 2000, polypropylene glycol having an average molecular weight of 3000, polypropylene glycol having an average molecular weight of 4000, neopentyl glycol, 2-butene-1,4-diol, 2,2,4-trimethyl-1,3-pentanediol, 1,4-bis-β-hydroxy-ethoxy-cyclohexane, 1,4-butanediol, 1,5-pentanediol, 1,6-hexanediol, 1,7-heptanediol, 1,8-octanediol, cyclohexane dimethanol, tricyclodecane dimethanol, hydrogenated bisphenol A, hydrogenated bisphenol F, ethylene oxide adducts of bisphenol A (having a number of added ethylene oxide of not more than 26), ethylene oxide adducts of bisphenol F (having a number of added ethylene oxide of not more than 21), ethylene oxide adducts of hydrogenated bisphenol A (having a number of added ethylene oxide of not more than 22), ethylene oxide adducts of hydrogenated bisphenol F (having a number of added ethylene oxide of not more than 17), propylene oxide adducts of bisphenol A, propylene oxide adducts of bisphenol F, propylene oxide adducts of hydrogenated bisphenol A, propylene oxide adducts of hydrogenated bisphenol F, hydroquinone dihydroxy-ethyl ether, p-xylene glycol, dihydroxy-ethyl sulfone, bis(2-hydroxyethyl)-2,4-tolylene dicarbamate, 2,4-tolylene-bis(2-hydroxyethyl-carbamide), bis(2-hydroxyethyl)-m-xylylene dicarbamate and bis(2-hydroxyethyl) isophthalate.

Suitably used herein also include compounds represented by the following general formulas (A), (B), (C), (D), (E) and whose log P value is greater than 0:

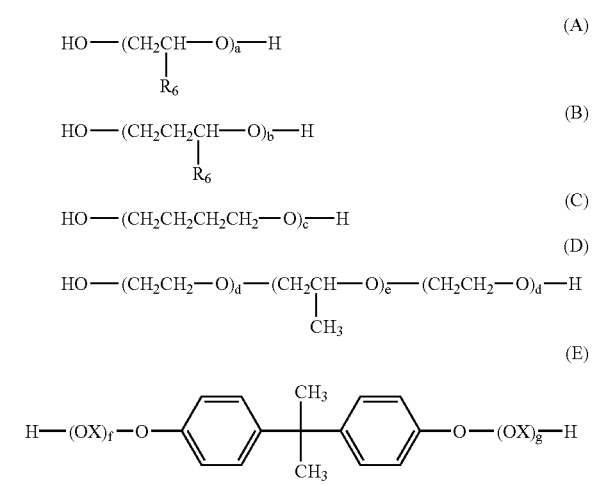

wherein, $R_6$ represents a hydrogen atom or a methyl group, provided that in Formula (A), $R_6$ is a methyl group. In addition, X represents the following groups.

Moreover, each of a, b, c, d, e, f, g in Formulas (A) to (E) represents an integer of not less than 2 and preferably an integer ranging from 2 to 100.

Specific examples of diols (iv) also include the polyester diol compounds represented by the general formulas (8), (9) and having a log P value of greater than 0.

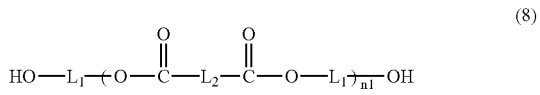

(9)

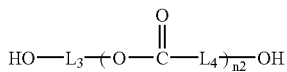

In the formulas, $L_1$, $L_2$ and $L_3$ may be the same or different and each represents a divalent aliphatic or aromatic hydrocarbon group and $L_4$ represents a divalent aliphatic hydrocarbon group. Preferably, $L_1$, $L_2$ and $L_3$ each represents an alkylene, alkenylene, alkynylene or arylene group and $L_4$ represents an alkylene group. The substituent $L_1$, $L_2$, $L_3$, $L_4$ may comprise other functional groups, which are not reactive with isocyanate groups, such as ether, carbonyl, ester, cyano, olefin, urethane, amide or ureide group or a halogen atom. Each of n1 and n2 represents an integer of not less than 2 and preferably an integer ranging from 2 to 100.

Polycarbonate diol compounds represented by the following general formula (10) and having a log P value of greater than 0 may likewise be listed as specific examples of diols (iv):

(10)

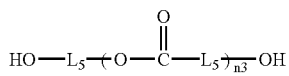

wherein, the substituents $L_5$ may be the same or different and each represents a divalent aliphatic or aromatic hydrocarbon group. Preferably, $L_5$ represents an alkylene, alkenylene, alkynylene or arylene group. Moreover, the substituents $L_5$ may comprise other functional groups, which are not reactive with isocyanate groups, such as ether, carbonyl, ester, cyano, olefin, urethane, amide or ureide group or a halogen atom and n3 represents an integer of not less than 2 and preferably an integer ranging from 2 to 100.

Specific examples of diol compounds represented by Formula (8), (9) or (10) include those listed below. In the following specific examples, n is an integer of not less than 2.

(No. 1)

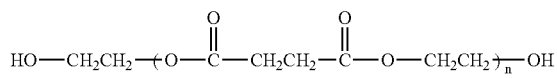

(No. 2)

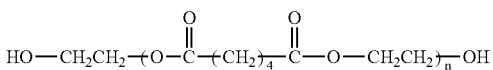

(No. 3)

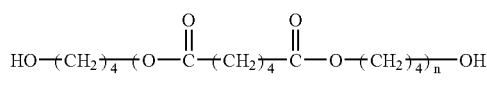

(No. 4)

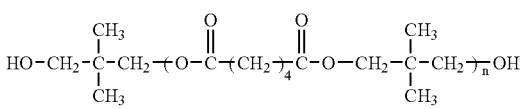

(No. 5)

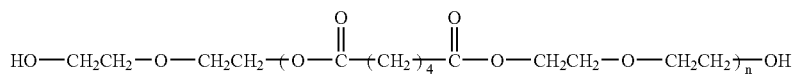

(No. 6)

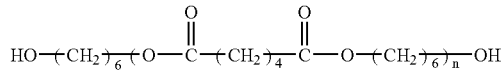

(No. 7)

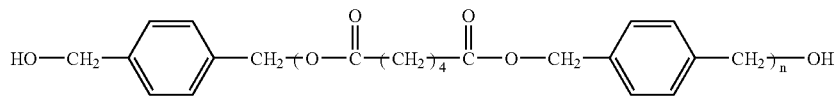

(No. 8)

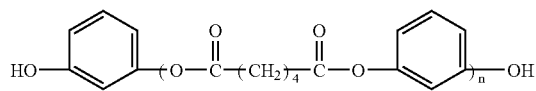

(No. 9)

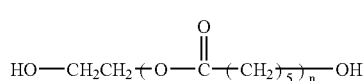

(No. 10)

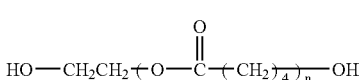

(No. 11)

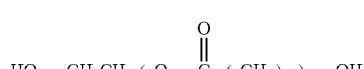

(No. 12)

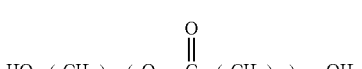

(No. 13)

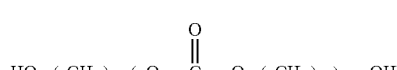

(No. 14)

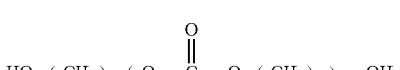

-continued (No. 16)
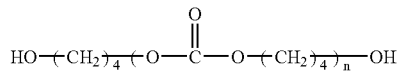

(No. 17)
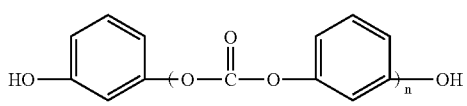

(No. 18)
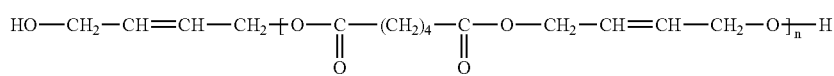

(No. 19)
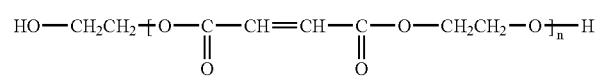

(No. 20)
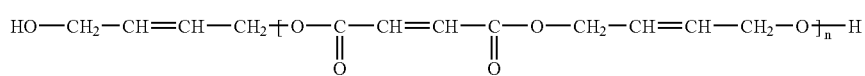

(No.21)
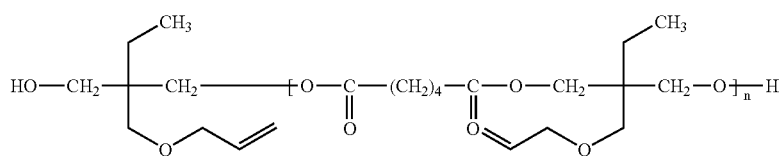

(No.22)
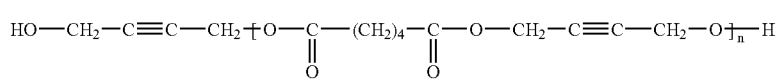

(No.23)
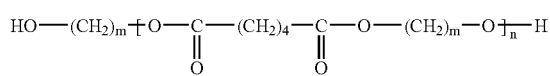

m = 2, 4

In the present invention, it is also possible to use diol compounds, which are free of any carboxyl group, which may have other substituents non-reactive with isocyanates and whose log P value is greater than 0.

Examples of such diol compounds include those listed below:

$$HO\text{-}L_6\text{-}O\text{—}CO\text{-}L_7\text{-}CO\text{—}O\text{-}L_6\text{-}OH \quad (11)$$

$$HO\text{-}L_7\text{-}CO\text{—}O\text{-}L_6\text{-}OH \quad (12)$$

wherein, $L_6$, $L_7$ may be the same or different and each represents a divalent aliphatic hydrocarbon group, aromatic hydrocarbon group or heterocyclic group, which may have a substituent (such as alkyl, aralkyl, aryl, alkoxy, aryloxy groups or halogen atoms (—F, —Cl, —Br, —I)). $L_6$, $L_7$ may, if needed, comprise other functional groups, which are not reactive with isocyanate groups, such as carbonyl, ester, urethane, amide or ureide groups. Further, $L_6$, $L_7$ may form a ring.

Specific examples of the compounds represented by Formula (11) or (12) include those listed below:

(No.101)
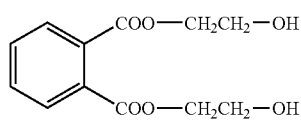

-continued (No.102)
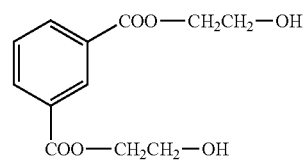

(No.103)
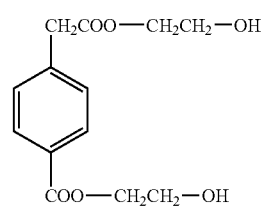

(No.104)
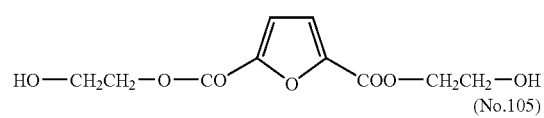

(No.105)
HO—CH$_2$CH$_2$—O—CO—CH=CH—COO—CH$_2$CH$_2$—OH (No.106)
HO—CH$_2$CH$_2$—O—COC$_{11}$H$_{22}$COO—CH$_2$CH$_2$—OH (No.107)
HO—CH$_2$CH$_2$—O—COC$_{12}$H$_{24}$COO—CH$_2$CH$_2$—OH (No.108)
HO—CH$_2$CH$_2$—O—COC$_{14}$H$_{28}$COO—CH$_2$CH$_2$—OH

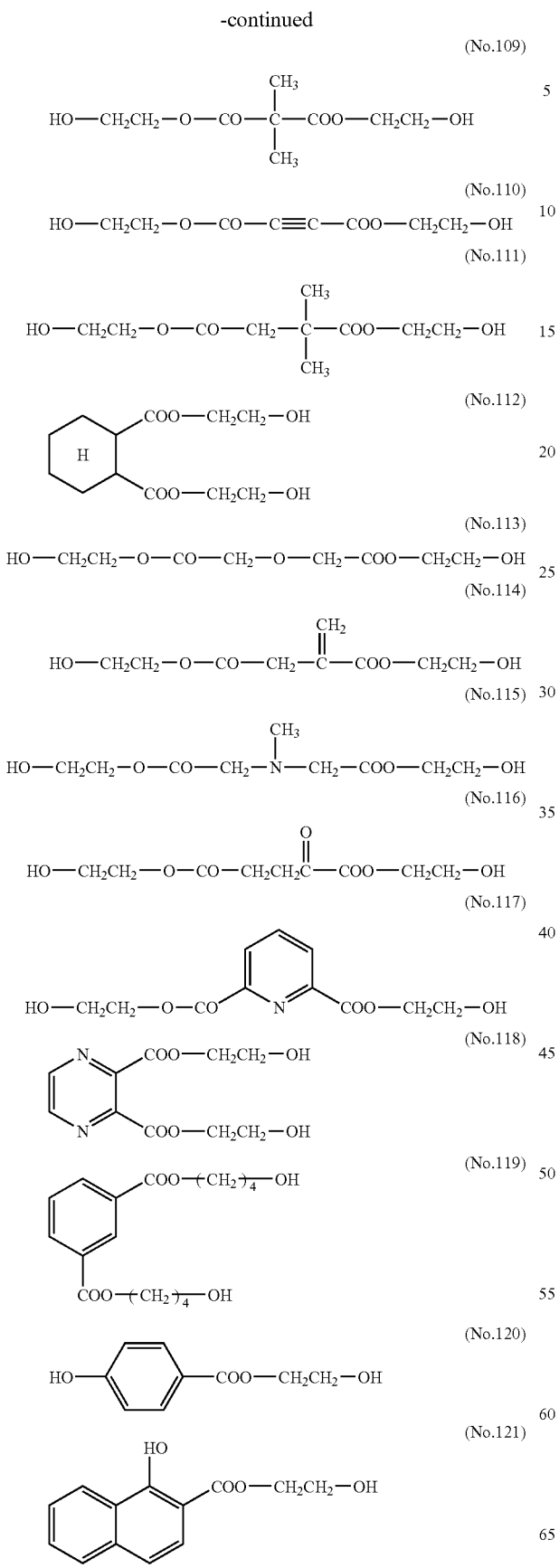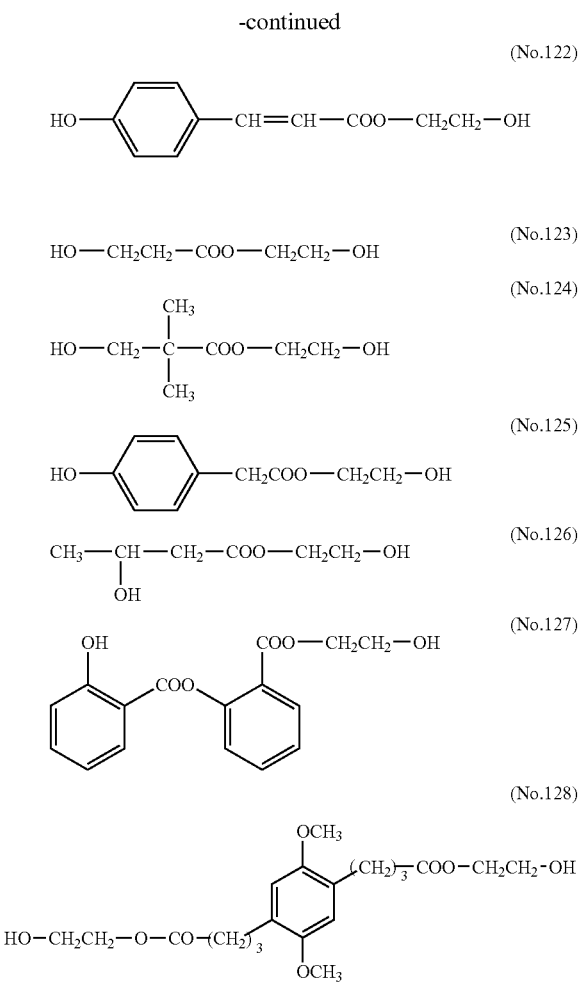

The following diol compounds may likewise be preferably used in the present invention:

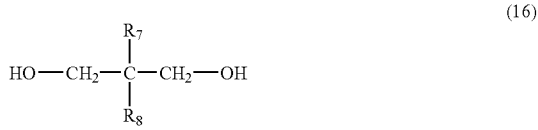 (16)

$$HO-CH_2-C\equiv C-CH_2-OH \qquad (17)$$

$$HO-CH_2-CH=CH-CH_2-OH \qquad (18)$$

wherein, $R_7$, $R_8$ may be the same or different and each represents a substituted or unsubstituted alkyl group and preferably an alkyl group having 1 to 10 carbon atoms, which may have substituents such as halogen atom (—F, —Cl, —Br, —I), cyano, nitro, —CONH$_2$, —COOR and/or —OR groups (wherein the substituents R may be the same or different and each represents an alkyl group having 1 to 10 carbon atoms, an aryl group having 7 to 15 carbon atoms or an aralkyl group).

Specific examples of the diol compounds represented by the formula (16) are those listed below:

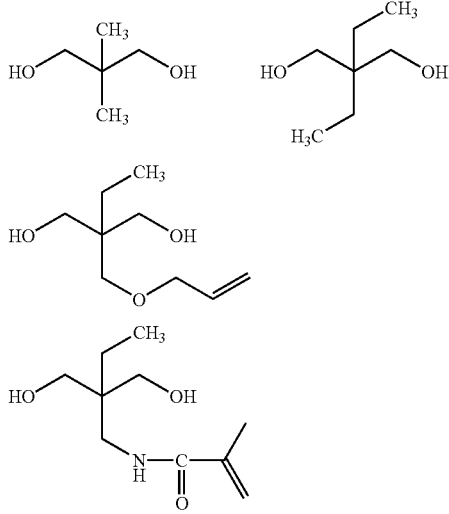

Examples of other diol compounds include 2-butyne-1,4-diol for the diol represented by the formula (17); and cis-2-butene-1,4-diol and trans-2-butene-1,4-diol for the diols represented by the formula (18).

Moreover, diol compounds suitably used in the present invention also include those described below:

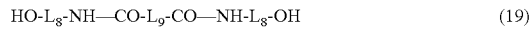 (19)

 (20)

wherein, $L_8$, $L_9$ may be the same or different and each represents a divalent aliphatic hydrocarbon group, aromatic hydrocarbon group or heterocyclic group, which may have a substituent (such as alkyl, aralkyl, aryl, alkoxy, aryloxy groups or halogen atoms (—F, —Cl, —Br, —I)). $L_8$, $L_9$ may, if needed, comprise other functional groups, which are not reactive with isocyanate groups, such as carbonyl, ester, urethane, amide or ureide groups. Further, $L_8$, $L_9$ may form a ring.

Specific examples of the compounds represented by Formula (19) or (20) include those listed below:

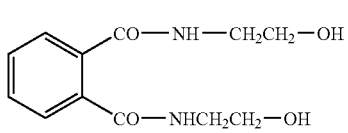 (No.201)

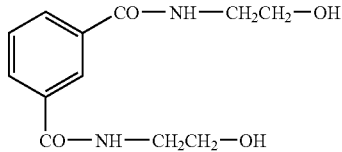 (No.202)

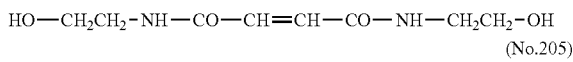 (No.203)

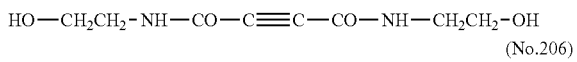 (No.204)

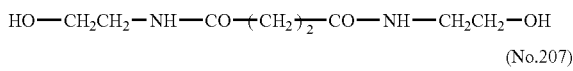 (No.205)

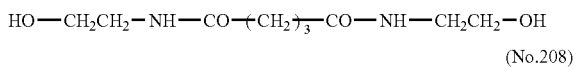 (No.206)

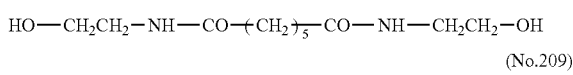 (No.207)

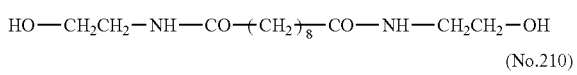 (No.208)

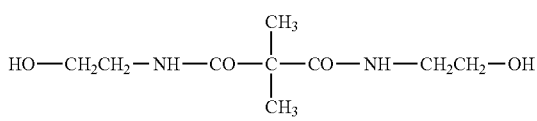 (No.209)

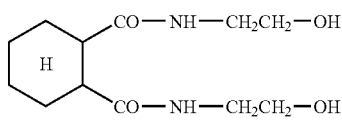 (No.210)

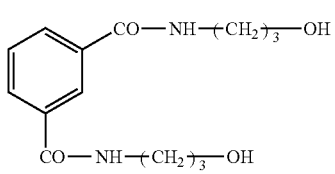 (No.211)

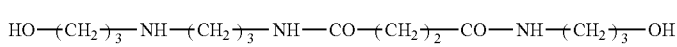 (No.212)

 (No.213)

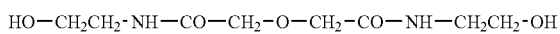 (No.214)

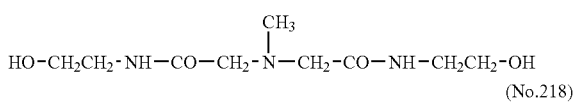 (No.215)

 (No.217)

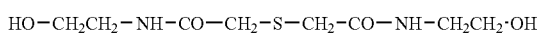 (No.216)

(No.218)

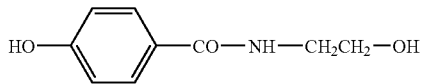 (No.219)

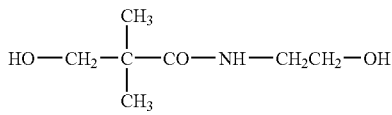 (No.220)

Furthermore, the following diol compounds may likewise be suitably used in the present invention:

$$HO-Ar_2-(L_{16}-Ar_3)_n-OH \quad (21)$$

$$HO-Ar_2-L_{16}-OH \quad (22)$$

wherein, $L_{16}$ represents a divalent aliphatic hydrocarbon group, which may have a substituent (such as alkyl, aralkyl, aryl, alkoxy, aryloxy and/or halogeno groups). $L_{16}$ may, if necessary, comprise other functional groups, which are not reactive with isocyanate groups, such as ester, urethane, amide or ureide groups.

$Ar_2$, $Ar_3$ may be the same or different and each represents a divalent aromatic hydrocarbon group, which may have a substituent and preferably an aromatic group having 6 to 15 carbon atoms.

n is an integer ranging from 0 to 10.

Specific examples of the diol compounds represented by the formula (21) or (22) include those listed below:

More specifically, examples thereof include catechol, resorcin, hydroquinone, 4-methyl catechol, 4-t-butyl catechol, 4-acetyl catechol, 3-methoxy catechol, 4-phenyl catechol, 4-methyl resorcin, 4-ethyl resorcin, 4-t-butyl resorcin, 4-hexyl resorcin, 4-chlororesorcin, 4-benzyl resorcin, 4-acetyl resorcin, 4-carbomethoxy resorcin, 2-methyl resorcin, 5-methyl resorcin, t-butyl hydroquinone, 2,5-di-t-butyl hydroquinone, 2,5-di-t-amyl hydroquinone, tetramethyl hydroquinone, tetrachloro-hydroquinone, methyl-carboamino-hydroquinone, methyl-ureido-hydroquinone, methylthio-hydroquinone, benzonorbornene-3,6-diol, bisphenol A, bisphenol S, 3,3'-dichloro-bisphenol S, 4,4'-dihydroxy-benzophenone, 4,4'-dihydroxy-biphenyl, 4,4'-thiodiphenol, 2,2'-di-hydroxy-diphenylmethane, 3,4-bis(p-hydroxyphenyl) hexane, 1,4-bis(2-(p-hydroxy-phenyl) propyl) benzene, bis(4-hydroxyphenyl) methylamine, 1,3-dihydroxy-naphthalene, 1,4-dihydroxy-naphthalene, 1,5-dihydroxy-naphthalene, 2,6-dihydroxy-naphthalene, 1,5-dihydroxy-anthraquinone, 2-hydroxybenzyl alcohol, 4-hydroxybenzyl alcohol, 2-hydroxy-3,5-di-t-butylbenzyl alcohol, 4-hydroxy-3,5-di-t-butylbenzyl alcohol, 4-hydroxyphenethyl alcohol, 2-hydroxyethyl-4-hydroxy-benzoate, 2-hydroxyethyl-4-hydroxyphenyl acetate and resorcin mono-2-hydroxyethyl ether. It is also possible to suitably use the following diol compounds:

The diol compound whose log P value is greater than 0 preferably has a log P value ranging from 0.5 to 30, more preferably 1 to 20, further preferably 2 to 15 and particularly preferably 3 to 15 from the viewpoint of the printing durability of the resulting printing plate. Moreover, the compounds represented by the general formulas (A) to (E) are preferred since the use thereof permits the preparation of a printing plate having good printing durability and the polypropylene glycols represented by the general formula (A) (wherein $R_6$ is a methyl group) are more preferably used herein among others. In addition, among the polypropylene glycols represented by the general formula (A) (wherein $R_6$ is a methyl group), preferred are those of Formula (A) wherein a ranges from 5 to 50, more preferably 10 to 40 and further preferably 15 to 30, from the viewpoint of good balance between the printing durability and the resistance to staining.

The content of the structure derived from the at least one diol compound having a log P value of greater than 0 in the urethane resin binder may appropriately be selected while taking into consideration a variety of factors such as the log P value of each specific diol compound used, the kinds of other diol components, the acid value and molecular weight of the resulting urethane resin binder and the composition and pH value of the developer used and it preferably ranges from 1 to 45 mole %, more preferably 5 to 40 mole %, further preferably 10 to 35 mole % and particularly preferably 15 to 30 mole %.

These diol compounds whose log P value is greater than 0 may be used alone or in any combination of at least two of them, but they are preferably used separately while taking into consideration the stability of the printing plate (such as sensitivity and printing durability).

(v) Other Amino Group-Containing Compounds

In the polyurethane resin binder used in the present invention, the following amino group-containing compound may simultaneously be reacted with the isocyanate compound represented by the formula (1) to form urea structures and to thus incorporate such structures into the structure of the polyurethane resin:

 (31)

 (32)

In the foregoing formulas, $R_{106}$, $R_{106'}$ may be the same or different and each represents a hydrogen atom or an alkyl, aralkyl or aryl group, which may have a substituent (such as an alkoxy, ester or carboxyl group or a halogen atom (—F, —Cl, —Br, —I)) and preferably a hydrogen atom or an alkyl group having 1 to 8 carbon atoms or an aryl group having 6 to 15 carbon atoms, which may be substituted with a carboxyl group. $L_{17}$ represents a divalent aliphatic hydrocarbon group, aromatic hydrocarbon group or heterocyclic group, which may have a substituent (such as alkyl, aralkyl, aryl, alkoxy, aryloxy groups or halogen atoms (—F, —Cl, —Br, —I)). $L_{17}$ may, if needed, comprise other functional groups, which are not reactive with isocyanate groups, such as carbonyl, ester, urethane or amide groups. Further, two out of $R_{106}$, $L_8$, $R_{106'}$ may bonded together to form a ring.

Specific examples of the compounds represented by Formula (31) or (32) include those listed below:

More specifically, examples of such compounds are aliphatic diamine compounds such as ethylene-diamine, propylene-diamine, tetramethylene-diamine, penta-methylenediamine, hexamethylene-diamine, heptamethylene-diamine, octamethylene-diamine, dodeca-methylene-diamine, propane-1,2-diamine, bis(3-aminopropyl) methylamine, 1,3-bis(3-aminopropyl) tetramethyl-siloxane, piperazine, 2,5-dimethyl piperazine, N-(2-aminoethyl) piperazine, 4-amino-2,2,6,6-tetramethyl piperidine, N,N-dimethyl ethylenediamine, lysine, L-cystine and isophorone-diamine; aromatic diamine compounds such as o-phenylene-diamine, m-phenylene-diamine, p-phenylene-diamine, 2,4-tolylene-diamine, benzidine, o-di-toluidine, o-di-anisidine, 4-nitro-m-phenylene-diamine, 2,5-dimethoxy-p-phenylenediamine, bis(4-aminophenyl) sulfone, 4-carboxy-o-phenylenediamine, 3-carboxy-m-phenylenediamine, 4,4'-diaminophenyl ether and 1,8-naphthalenediamine; heterocyclic amine compounds such as 2-amino-imidazole, 3-aminotriazole, 5-amino-1H-tetrazole, 4-aminopyrazole, 2-aminobenz-imidazole, 2-amino-5-carboxy-triazole, 2,4-diamino-6-methyl-S-triazine, 2,6-diamino-pyridine, L-histidine, DL-tryptophane and adenine; and amino-alcohols or amino-phenol compounds such as ethanolamine, N-methyl ethanolamine, N-ethyl ethanol-amine, 1-amino-2-propanol, 1-amino-3-propanol, 2-aminoethoxy ethanol, 2-aminothio-ethoxy ethanol, 2-amino-2-methyl-1-propanol, p-aminophenol, m-aminophenol, o-aminophenol, 4-methyl-2-aminophenol, 2-chloro-4-aminophenol, 4-methoxy-3-amino-phenol, 4-hydroxy-benzylamine, 4-amino-1-naphthol, 4-aminosalicylic acid, 4-hydroxy-N-phenyl-glycine, 2-amino-benzyl alcohol, 4-amino-phenethyl alcohol, 2-carboxy-5-amino-1-naphthol and L-tyrosine.

The polyurethane resin used in the present invention can be synthesized by dispersing the foregoing isocyanate and diol compounds in an aprotic solvent, adding, to the dispersion, a known catalyst having an activity corresponding to the reactivity of the starting compounds and then heating the reaction system. The molar ratio of the di-isocyanate compound (i) to the sum of the diol compounds (the sum of the compounds (ii), (iii) and (iv)) or the molar ratio of the di-isocyanate compound (i) to the sum of the compounds other than the di-isocyanate compound (the total molar amount of the compounds (ii), (iii), (iv) and (v)) in case where the reaction system arbitrarily comprises other components or amino group-containing compounds (v) preferably ranges from 0.8:1 to 1.2:1. In this respect, if isocyanate groups remain at the termini of the resulting polymer, the polymer is treated with alcohols or amines to thus ultimately synthesize a polyurethane resin free of any remaining isocyanate group.

Among the polyurethane resin binders used in the light-sensitive layer of the present invention as an essential component, preferred are polyurethane resins comprising carboxyl groups in an amount ranging from 0.2 to 4.0 meq/g, preferably 0.3 to 3.0 meq/g, further preferably 0.4 to 2.0 meq/g, particularly preferably 0.5 to 1.5 meq/g and most preferably 0.6 to 1.2 meq/g.

The polyurethane resin binder preferably used in the present invention one having an acid value ranging from 0.6 to 1.2 meq/g and synthesized from the following ingredients:

① at least two di-isocyanate compounds or a combination of at least one aliphatic di-isocyanate compound (L is an aliphatic group) and at least one aromatic di-isocyanate compound (L is an aromatic group), ② at least one diol compound having a carboxyl group represented by the general formula (2),

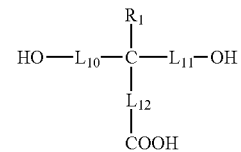

wherein, $R_1$ represents a hydrogen atom or an alkyl, aralkyl, aryl, alkoxy or aryloxy group, which may have a substituent, and $L_{10}$, $L_{11}$ and $L_{12}$ may be the same or different and each represents a single bond or a divalent aliphatic or aromatic hydrocarbon group, which may have a substituent, ③ at least one diol compound whose log P value ranges from −5 to −1.2, and ④ at least one diol compound whose log P value ranges from 3 to 10.

These polyurethane resins may be used alone or in the form of any mixture.

The content of these polyurethane resins included in the light-sensitive composition ranges from 10 to 90% by mass, preferably 15 to 80% by mass, more preferably 20 to 70% by mass, further preferably 25 to 60% by mass and most preferably 30 to 50% by mass.

i) As specific examples of polyurethane resins more preferably used herein, there may be listed the following compounds, but the present invention is not restricted to these specific examples at all. The majority of the specific examples thereof are indicated or specified by the combinations of di-isocyanate compounds and diol compounds used. In addition, the carboxyl group content is expressed in terms of the acid value.

| | Polyurethane resin | | | |
|---|---|---|---|---|
| Di-isocyanate compounds | (mole %) | Diol compounds | (mole %) | acid value (meq/g) |
| (1) (i)-1 | (50) | (ii)-1 | (20) | 0.42 |
| | | (iii)-6 | (20) | |
| | | (iv)-4 | (10) | |
| (2) (i)-2 | (50) | (ii)-2 | (10) | 0.56 |
| | | (iii)-1 | (15) | |
| | | (iv)-9 | (25) | |
| (3) (i)-3 | (30) | (ii)-3 | (15) | 0.70 |
| (i)-5 | (20) | (iii)-3 | (15) | |
| | | (iv)-1 | (20) | |
| (4) (i)-2 | (5) | (ii)-4 | (20) | 0.88 |
| (i)-6 | (45) | (iii)-2 | (20) | |
| | | (iv)-11 | (5) | |
| | | (v)-1 | (5) | |
| (5) (i)-1 | (40) | (ii)-1 | (40) | 1.49 |
| (i)-4 | (10) | (iii)-5 | (5) | |
| | | (iv)-5 | (5) | |
| (6) (i)-2 | (25) | (ii)-3 | (30) | 0.93 |
| (i)-5 | (25) | (iii)-4 | (10) | |
| | | (iv)-7 | (10) | |
| (7) (i)-1 | (40) | (ii)-1 | (25) | 0.90 |
| (i)-2 | (10) | (iii)-2 | (15) | |
| | | (iv)-12 | (10) | |
| (8) (i)-5 | (25) | (ii)-1 | (35) | 1.84 |
| (i)-6 | (25) | (iii)-3 | (10) | |
| | | (iv)-8 | (5) | |
| (9) (i)-2 | (10) | (ii)-1 | (40) | 2.46 |
| (i)-6 | (40) | (iii)-1 | (5) | |
| | | (iv)-2 | (5) | |

-continued

Polyurethane resin

| | Di-isocyanate compounds | (mole %) | Diol compounds | (mole %) | acid value (meq/g) |
|---|---|---|---|---|---|
| (10) | (i)-5 | (50) | (ii)-2 | (20) | 0.68 |
| | | | (iii)-1 | (10) | |
| | | | (iv)-13 | (10) | |
| | | | (v)-2 | (10) | |
| (11) | (i)-1 | (40) | (ii)-1 | (40) | 1.40 |
| | (i)-2 | (10) | (iii)-3 | (5) | |
| | | | (iv)-16 | (5) | |
| (12) | (i)-1 | (40) | (ii)-1 | (20) | 0.32 |
| | (i)-2 | (10) | (iii)-5 | (20) | |
| | | | (iv)-14 | (10) | |
| (13) | (i)-1 | (40) | (ii)-1 | (25) | 0.62 |
| | (i)-2 | (10) | (iii)-6 | (15) | |
| | | | (iv)-17 | (10) | |
| (14) | (i)-1 | (40) | (ii)-4 | (35) | 1.08 |
| | (i)-2 | (10) | (iii)-5 | (5) | |
| | | | (iv)-3 | (10) | |
| (15) | (i)-1 | (40) | (ii)-1 | (30) | 0.86 |
| | (i)-2 | (10) | (iii)-4 | (10) | |
| | | | (iv)-15 | (10) | |
| (16) | (i)-1 | (40) | (ii)-1 | (25) | 1.42 |
| | (i)-2 | (10) | (iii)-1 | (15) | |
| | | | (iv)-10 | (10) | |
| (17) | (i)-1 | (40) | (ii)-1 | (10) | 0.89 |
| | (i)-2 | (10) | (ii)-4 | (10) | |
| | | | (iii)-2 | (20) | |
| | | | (iv)-6 | (10) | |
| (18) | (i)-1 | (40) | (ii)-1 | (20) | 0.74 |
| | (i)-2 | (10) | (iii)-2 | (15) | |
| | | | (iii)-4 | (5) | |
| | | | (iv)-11 | (10) | |
| (19) | (i)-1 | (40) | (ii)-1 | (20) | 0.78 |
| | (i)-2 | (10) | (iii)-2 | (15) | |
| | | | (iv)-4 | (10) | |
| | | | (iv)-15 | (5) | |
| (20) | (i)-1 | (40) | (ii)-1 | (25) | 0.68 |
| | (i)-2 | (10) | (iii)-5 | (10) | |
| | | | (iv)-6 | (15) | |
| (21) | (i)-1 | (40) | (ii)-3 | (40) | 1.27 |
| | (i)-2 | (10) | (iii)-3 | (5) | |
| | | | (iv)-12 | (5) | |
| (22) | (i)-1 | (40) | (ii)-1 | (20) | 0.93 |
| | (i)-2 | (10) | (iii)-2 | (10) | |
| | | | (iv)-9 | (20) | |
| (23) | (i)-1 | (40) | (ii)-1 | (25) | 0.91 |
| | (i)-2 | (10) | (iii)-5 | (5) | |
| | | | (iv)-7 | (20) | |
| (24) | (i)-1 | (40) | (ii)-1 | (30) | 1.15 |
| | (i)-2 | (10) | (iii)-1 | (10) | |
| | | | (iv)-12 | (10) | |
| (25) | (i)-1 | (40) | (ii)-1 | (10) | 0.69 |
| | (i)-2 | (10) | (ii)-2 | (10) | |
| | | | (iii)-2 | (10) | |
| | | | (iii)-3 | (10) | |
| | | | (iv)-12 | (10) | |

Di-isocyanate Compounds (i)

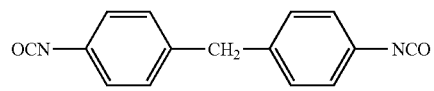
(i)-1

(i)-2

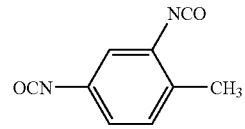
(i)-3

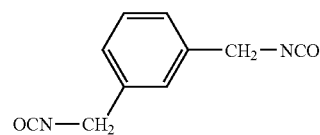
(i)-4

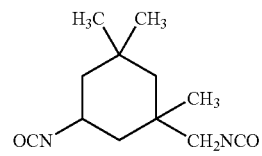
(i)-5

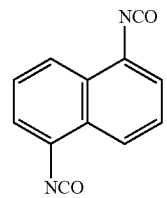
(i)-6

Diol Compounds Having Carboxyl Group(s) (ii)

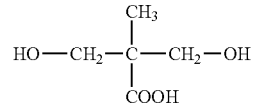
(ii)-1

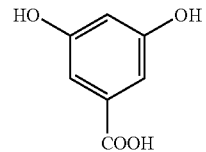
(ii)-2

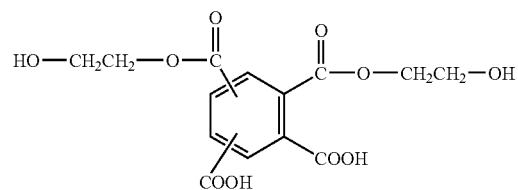
(ii)-3

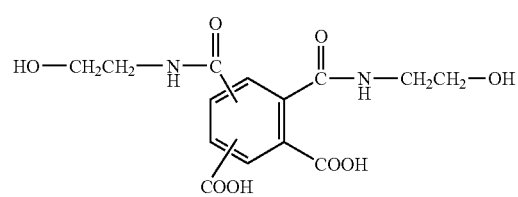
(ii)-4

(iii) Diol Compounds having a log P Value of Less than 0

$$HO\text{-}(CH_2CH_2O)_n\text{-}H$$

|  |  | logP Value |
|---|---|---|
| n = 2 | (iii)-1 | −0.87 |
| n = 4 | (iii)-2 | −1.20 |
| Polyethylene glycol having number average molecular weight of 300 | (iii)-3 | −1.60 |
| Polyethylene glycol having number average molecular weight of 1000 | (iii)-4 | −4.22 |
| Polyethylene glycol having number average molecular weight of 2000 | (iii)-5 | −7.97 |

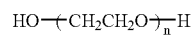

| m + n なL30(hydroxyl value: 72 mg KOH/g) | (iii)-6 | −1.78 |

(iv) Diol Compounds having a log P Value of Greater than 0

|  | log P Value |
|---|---|
| HO-(CH$_2$)$_8$-OH <br> (iv)-1 | 1.38 |
| HO—CH$_2$—C(CH$_3$)(CH$_3$)—CH$_2$—OH <br> (iv)-2 | 0.45 |
| HO—CH$_2$—⟨cyclohexane⟩—CH$_2$—OH <br> (iv)-3 | 0.89 |
| HO—CH$_2$—⟨tricyclic⟩—CH$_2$OH <br> (iv)-4 | 1.20 |
| HO—CH$_2$—C(C$_2$H$_5$)(CH$_2$—O—CH$_2$CH=CH$_2$)—CH$_2$—OH <br> (iv)-5 | 0.86 |
| HO—⟨C$_6$H$_4$⟩—C(CH$_3$)$_2$—⟨C$_6$H$_4$⟩—OH <br> (iv)-6 | 4.32 |

-continued

| | log P Value |
|---|---|
| HO—CF₂CF₂—OH<br>(iv)-7 | 1.20 |
| 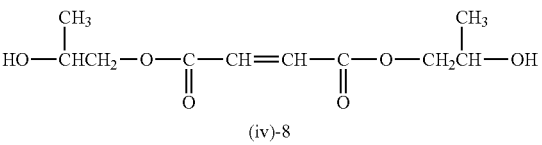<br>(iv)-8 | 0.05 |
| 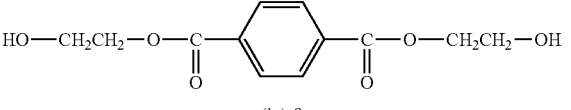<br>(iv)-9 | 0.62 |
| 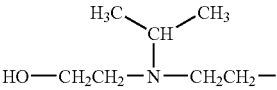<br>(iv)-10 | 0.03 |
| 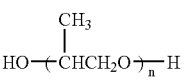<br>number average molecular weight 425 (iv)-11<br>number average molecular weight 1000 (iv)-12 | 1.19<br>3.65 |
| HO—(CH₂CH=CHCH₂)ₙ—OH<br>number average molecular weight 1200 (iv)-13<br>(hydroxyl value 95 mg KOH g) | 26.6 |
| 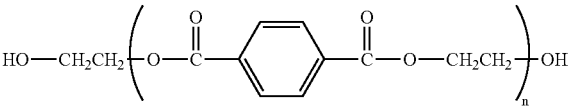<br>number average molecular weight 850 (iv)-14<br>(hydroxyl value 135 mg KOH g | 4.61 |
| 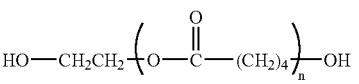<br>number average molecular weight 1000 (iv)-15<br>(hydroxyl value 112 mg KOH g | 3.08 |
| 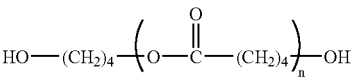<br>number average molecular weight 2000 (iv)-16<br>(hydroxyl value 56 mg KOH g | 7.49 |
| 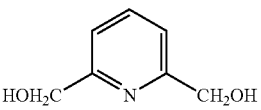<br>(iv)-17 | 0.46 |

(v) Other amino group-containing compounds

HO—CH₂CH₂—NH₂
(v)-1

| | log P Value |
|---|---|
| 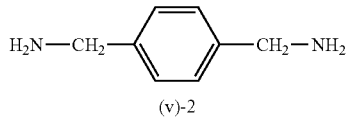  (v)-2 | |

The light-sensitive layer of the PS plate of the present invention may comprise additional organic polymers soluble or swellable in an aqueous alkaline solution in addition to the polyurethane resin binder described above. For example, use of a water-soluble organic polymer makes it possible to develop the light-sensitive layer with water.

Examples of such organic polymers include addition polymers having a carboxyl group in the side chain thereof, such as methacrylic acid copolymers, acrylic acid copolymers, itaconic acid copolymers, crotonic acid copolymers, maleic acid copolymers, and partially esterified maleic acid copolymers as disclosed in J.P. KOKAI Nos. Sho 59-44615, Sho 54-92723, Sho 59-53836 and Sho 59-71048, and J.P. KOKOKU Nos. Sho 54-34327, Sho 58-12577 and Sho 54-25957.

Also, acidic cellulose derivatives having a carboxyl group in the side chain thereof are included. In addition to the above, polymers obtained by adding a cyclic acid anhydride to an addition polymer having hydroxyl group can also be used.

Among the polymers which are preferable are copolymers of benzyl (meth)acrylate, (meth)acrylic acid and other optional addition-polymerizable vinyl monomers and copolymers of allyl (meth)acrylate, (meth)acrylic acid and other optional addition-polymerizable vinyl monomers. Further, polyvinyl pyrrolidone and polyethylene oxide are useful as the water-soluble organic polymers. Alcohol-soluble polyamides and polyethers of 2,2-bis-(4-hydroxyphenyl)-propane with epichlorohydrin are also useful as the component (b) for increasing the strength of the cured film.

Furthermore, polyurethane resins as disclosed in J.P. KOKOKU Nos. Hei 7-120040, Hei 7-120041, Hei 7-120042 and Hei 8-12424, and J.P. KOKAI Nos. Sho 63-287944, Sho 63-287947, Hei 1-271741 and Hei 11-352691 are also useful in the present invention.

The strength of the cured film of the light-sensitive layer can be improved by introducing a radical reactive group into the side chain of the above-mentioned polymer. Examples of the functional groups that can readily cause addition-polymerization reaction are ethylenically unsaturated bond group, amino group, and epoxy group; examples of the functional groups that can be formed into radicals by light exposure are mercapto group, thiol group, halogen atoms, triazine structure, and onium salt structure; and examples of polar groups are carboxyl group and imide group. The ethylenically unsaturated bond groups such as acryl group, methacryl group, allyl group and styryl group are particularly preferable as the functional groups that can readily cause addition-polymerization reaction, and in addition, other functional groups selected from the group consisting of amino group, hydroxyl group, phosphonic acid group, phosphoric acid group, carbamoyl group, isocyanate group, ureido group, ureylene group, sulfonic acid group, and ammonio group are also useful.

It is preferable that the above-mentioned polyurethane resin binder be controlled to have an appropriate molecular weight and acid value in order to maintain the development performance of a photopolymerizable composition. In consideration of development using the developer of the present invention, it is preferable to use any of the above-mentioned polymers with a weight-average molecular weight (by GPC method, polystyrene standard) of from 5,000 to 500,000, preferably from 10,000 to 30,000 and more preferably from 20,000 to 150,000. If the weight-average molecular weight is lower than 5,000, printing durability of the PS plate would become insufficient, while the weight-average molecular weight exceeds 500,000, development performance would become deteriorated to result in cause of scumming.

A preferred acid value of the polyurethane resin binder is in the range of from 0.2 to 4.0 meq/g, preferably 0.3 to 3.0 meq/g, more preferably from 0.4 to 2.0 meq/g, specifically 0.5 to 1.5 meq/g and most preferably from 0.6 to 1.2 meq/g. If the acid value is less than 0.2 meq/g, scumming of the lithographic printing plate causes due to insufficient development performance, while the acid value exceeds 6.0 meq/g, the printing durability of the PS plate would become deteriorated.

[Acid Value of the Light-Sensitive Layer]

The acid value of the light-sensitive layer referred to in the present invention is an amount equivalent to an acid with pKa of 9 or less contained in units per gram of the light-sensitive layer that is provided on the substrate. In the calculation of the acid value, overcoat layers including an oxygen barrier layer, which are provided on the light-sensitive layer are not considered. The acid value of the light-sensitive layer can be experimentally obtained by titration using an aqueous solution of sodium hydroxide, and also by calculation from the total content of compounds having acid groups with pKa of 9 or less in the photopolymerizable composition.

The acid value of the light-sensitive layer can be controlled by changing the amount ratio of the monomer of cross-linking agent to that of the binder polymer having acid group, or by employing a low-acid value binder polymer containing a smaller amount of acid group.

In the latter case, the use of a binder polymer with an acid value ranging from 0.2 to 4.0 meq/g, more preferably from 0.3 to 3.0 meq/g, further preferably from 0.4 to 2.0 meq/g, specifically from 0.5 to 1.5 meq/g and most preferably from 0.6 to 1.2 meq/g, is effective.

It is preferable that the light-sensitive layer of the PS plate for use in the present invention has an acid value of 1.0 meq/g or less, more preferably in the range of 0.20 to 0.60 meq/g in the light of the application to the lithographic printing plate, and most preferably in the range of 0.30 to 0.50 meq/g in terms of image-forming performance.

Such an organic polymer can be incorporated into the photopolymerizable composition in any suitable amounts.

However, if the amount of the organic polymer exceeds 90%, undesirable problems will arise, for instance, the strength of images formed by development may be insufficient. In light of this, the amount of the organic polymer is preferably in the range of from 10 to 90%, more preferably from 30 to 80%. It is preferable that the weight ratio of the photopolymerizable ethylenically unsaturated compound to the organic polymer is in the range of 1:9 to 9:1, more preferably 2:8 to 8:2, and further preferably 3:7 to 7:3.

Next, the component (b) will be described. The component (b), that is, a compound having at least one addition-polymerizable ethylenically unsaturated double bond can be selected freely from the group consisting of compounds having at least one, preferably two or more ethylenically unsaturated bonds.

The component (b) may be in any form such as a monomer, a prepolymer including a dimer, trimer and oligomer, or a mixture and copolymer thereof.

Examples of the aforementioned monomers and copolymers thereof include esters of unsaturated carboxylic acids such as acrylic acid, methacrylic acid, itaconic acid, crotonic acid, isocrotonic acid, and maleic acid with aliphatic polyhydric alcohol compounds and amides of aliphatic polyvalent amine compounds with unsaturated carboxylic acids.

Specific examples of the esters prepared from the unsaturated carboxylic acids and the aliphatic polyhydric alcohol compounds include:

acrylates such as ethylene glycol diacrylate, trimethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, and polyester acrylate oligomers;

methacrylates such as tetramethylene glycol dimethacrylate, trimethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dip entaerythritol pentamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane;

itaconates such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate;

crotonates such as ethylene glycol dicrotonate, tetramethylene glycol dicrotonate, pentaerythritol dicrotonate, and sorbitol tetradicrotonate;

isocrotonates such as ethylene glycol diisocrotonate, pentaerythritol diisocrotonate, and sorbitol tetraisocrotonate;

maleates such as ethylene glycol dimaleate, triethylene glycol dimaleate, pentaerythritol dimaleate, and sorbitol tetramaleate; and mixtures of the above-mentioned ester monomers.

Specific examples of the amide monomers prepared from the aliphatic polyvalent amine compounds and the unsaturated carboxylic acids include methylenebis-acrylamide, methylenebis-methacrylamide, 1,6-hexamethylenebis-acrylamide, 1,6-hexamethylenebis-methacrylamide, diethylenetriamine trisacrylamide, xylylenebis-acrylamide, and xylylenebis-methacrylamide.

Examples of the component (b) further include vinyl urethane compounds, each having at least two polymerizable vinyl groups in the molecule thereof, obtained by adding a vinyl monomer having a hydroxyl group represented by the following general formula (X) to a polyisocyanate compound having at least two isocyanate groups in the molecule thereof as disclosed in Japanese Patent Publication for Opposition Purpose (hereunder referred to as "J.P. KOKOKU) No. Sho 48-41708:

$$CH_2=C(R_{40})COOCH_2CH(R_{50})OH \quad (X)$$

wherein $R_{40}$ and $R_{50}$ are each independently H or $CH_3$.

Furthermore, other examples of the component (a) for use in the present invention are urethane acrylates as disclosed in J.P. KOKAI No. Sho 51-37193 and J.P. KOKOKU No. Hei 2-32293; polyester acrylates as disclosed in J.P. KOKAI No. Sho 48-64183 and J.P. KOKOKU Nos. Sho 49-43191 and Sho 52-30490; polyfunctional (meth)acrylates such as epoxy acrylates obtained through reactions of epoxy resins with (meth)acrylic acid; and photo-curable monomers and oligomers disclosed in Journal of Japan Adhesion Society, 1984, Vol. 20, No. 7, pp. 300–308.

The amount of the component (a) suitably ranges from 5 to 70% by weight (hereinafter simply referred to as "%"), preferably 10 to 50% based on the total weight of the overall components.

The component (c) for use in the light-sensitive layer of the PS plate is a photopolymerization initiator. Depending upon the wavelength of light emitting from the employed light source, the photopolymerization initiator may appropriately be selected from a variety of photopolymerization initiators well known in patents and references. Further, two or more polymerization initiators may be used in combination to prepare a combined initiator system.

Some combined initiator systems are proposed to cope with the light sources of visible light with a wavelength of 400 nm or more, Ar laser, second harmonic wave of semiconductor laser, and SHG-YAG laser. For instance, U.S. Pat. No. 2,850,445 discloses certain dyes capable of causing photoreduction such as Rose Bengal, Eosine, and Erythrosine. Moreover, combined initiator systems using a dye and an initiator are as follows: a composite initiator system of a dye and an amine (J.P. KOKOKU No. Sho 44-20189); a combined system of hexaarylbiimidazole, a radical generator and a dye (J.P. KOKOKU No. Sho 45-37377); a system of hexaarylbiimidazole and p-dialkylaminobenzylidene ketone (J.P. KOKOKU No. Sho 47-2528 and J.P. KOKAI No. Sho 54-155292); a system comprising a cyclic cis-α-dicarbonyl compound and a dye (J.P. KOKAI No. Sho 48-84183); a system comprising a cyclic triazine and a merocyanine dye (J.P. KOKAI No. Sho 54-151024); a system comprising a 3-ketocoumarin compound and an activator (J.P. KOKAI Nos. Sho 52-112681 and Sho 58-15503); a system comprising biimidazole, a styrene derivative, and a thiol (J.P. KOKAI No. Sho 59-140203); a system comprising an organic peroxide and a dye (J.P. KOKAI Nos. Sho 59-1504, Sho 59-140203, Sho 59-189340 and Sho 62-174203, J.P. KOKOKU No. Sho 62-1641, and U.S. Pat. No. 4,766,055); a system comprising a dye and an active halogen compound (J.P. KOKAI Nos. Sho 63-258903 and Hei 2-63054); a system comprising a dye and a borate compound (J.P. KOKAI Nos. Sho 62-143044, Sho 62-150242, Sho 64-13140, Sho 64-13141, Sho 64-13142, Sho 64-13143, Sho 64-13144, Sho 64-17048, Hei 1-229003, Hei 1-298348 and Hei 1-138204); a system comprising a dye with a rhodanine ring and a radical generator (J.P. KOKAI Nos. Hei 2-179643 and Hei 2-244050); a system comprising titanocene and a 3-ketocoumarin dye (J.P. KOKAI No. Sho 63-221110); a system comprising titanocene, a xanthene dye and an addition-polymerizable ethylenically unsaturated compound having amino group or urethane group (J.P. KOKAI Nos. Hei 4-221958 and Hei 4-219756); a system comprising titanocene and a particular merocyanine dye (J.P. KOKAI No. Hei 6-295061); and a system comprising titanocene, a dye having benzopyran ring (J.P. KOKAI No. Hei 8-334897) and the like.

Of the above-mentioned initiator systems, the systems using titanocene compounds are particularly preferred because of excellent sensitivity.

The titanocene compounds may appropriately be selected, for example, from a variety of titanocene compounds as disclosed in J.P. KOKAI Nos. Sho 59-152396 and Sho 61-151197.

Specific examples of such titanocene compounds are as follows: di-cyclopentadienyl-Ti-di-chloride, di-cyclopentadienyl-Ti-bis-phenyl, di-cyclopentadienyl-Ti-bis-2,3,4,5,6-pentafluorophen-1-yl, di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-bis-2,6-difluorophen-1-yl, di-cyclopentadienyl-Ti-bis-2,4-difluorophen-1-yl, di-methylcyclopentadienyl-Ti-bis-2,3,4,5,6-tetrafluorophen-1-yl, di-methylcyclopentadienyl-Ti-bis-2,6-difluorophen-1-yl, and di-cyclopentadienyl-Ti-bis-2,6-difluoro-3-(pyrro-1-yl)-phen-1-yl.

Furthermore, some assistants such as an amine compound and a thiol compound may be added to the photopolymerization initiator when necessary. The addition of such hydrogen-donating compounds can enhance the performance of the employed photopolymerization initiator.

The amount of the photopolymerization initiator is suitably in the range of 0.05 to 100 parts by weight, preferably 0.1 to 70 parts by weight, and more preferably 0.2 to 50 parts by weight, with respect to 100 parts by weight of the ethylenically unsaturated compound.

In addition to the foregoing fundamental components (a), (b) and (c), a small amount of thermal polymerization inhibitor is desirably contained in the photopolymerizable composition to inhibit undesired thermal polymerization of the polymerizable ethylenically unsaturated compound during preparation or storage of the photopolymerizable composition. Examples of such thermal polymerization inhibitors include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), N-nitrosophenyl hydroxylamine cerium salt and N-nitrosophenyl hydroxylamine aluminum salt. The amount of the thermal polymerization inhibitor is preferably from about 0.01 to about 5% based on the total weight of the photopolymerizable composition. In addition, the photopolymerizable composition may optionally comprise, for example, higher fatty acid derivatives such as behenic acid and behenic acid amide when necessary. To effectively eliminate the polymerization inhibitory effect of oxygen, such higher fatty acid derivatives may be localized in the surface portion of the light-sensitive layer at the drying step for the formation of the light-sensitive layer. The amount of the higher fatty acid derivatives is preferably from about 0.5 to about 10% based on the total weight of the photopolymerizable composition.

Furthermore, the composition may further comprise a coloring agent for pigmenting the resulting light-sensitive layer. Examples of the coloring agent include pigments such as phthalocyanine pigments (C.I. Pigment Blue 15:3, 15:4, 15:6 and the like), azo pigments, carbon black, and titanium oxide; and dyes such as Ethyl Violet, Crystal Violet, azo dyes, anthraquinone dyes and cyanine dyes. The amount of the coloring agent including such pigments and dyes is preferably from about 0.5 to about 20% based on the total weight of solid content in the obtained light-sensitive layer.

Moreover, the photopolymerizable composition may further comprise inorganic fillers and plasticizers such as dioctyl phthalate, dimethyl phthalate and tricresyl phosphate for improving the physical properties of the resultant cured film. The amount of such additives including the inorganic fillers and plasticizers is preferably 10% or less of the total weight of solid content in the obtained light-sensitive layer.

To provide the light-sensitive layer on a substrate, which will be described later, the photopolymerizable composition is dissolved in various kinds of organic solvents to prepare a coating liquid and then the coating liquid is applied onto the surface of the substrate. Examples of the solvents include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimetylformamide, dimethyl sulfoxide, γ-butyrolactone, methyl lactate, and ethyl lactate. These solvents may be used alone or in combination. The concentration of the solid content in the coating liquid is suitably from 1 to 50% by weight.

To improve the surface quality of the coated surface, the photopolymerizable composition for use in the light-sensitive layer may further comprise a surfactant.

When the coating liquid for the light-sensitive layer is applied, the coating amount is preferably from about 0.1 to about 10 g/m$^2$, preferably from 0.3 to 5 g/m$^2$, and more preferably from 0.5 to 3 g/m$^2$, after it is dried.

(Substrate)

Any dimensionally stable plate-shaped materials can be used as the substrates for the PS plate for use in the present invention. In light of dimensional stability, aluminum substrates are particularly preferred. Aluminum plates substantially composed of aluminum and aluminum-containing alloys, for example, alloys of aluminum with metals such as silicon, copper, manganese, magnesium, chromium, zinc, lead, bismuth and nickel can be used. Alternatively, an aluminum or aluminum alloy sheet may be attached to a sheet of paper or a plastic film to form a laminate sheet, or aluminum or aluminum alloys may be deposited thereon. Further, a composite sheet obtained by attaching an aluminum sheet to a polyethylene terephthalate film as disclosed in J.P. KOKOKU No. Sho 48-18327 is also preferably used as the substrate of the PS plate.

Such aluminum substrates are subjected to various kinds of surface treatment.

(Graining)

One of the surface treatment methods for the aluminum substrates is graining, i.e., mechanical surface-graining, chemical etching, electrolytical graining as disclosed in J.P. KOKAI No. Sho 56-28893. To be more specific, the surface of the aluminum substrate may be electrochemically grained in an electrolytic solution comprising hydrochloric acid or nitric acid. Alternatively, the aluminum surface may be subjected to mechanical graining such as wire brush graining by rubbing the aluminum surface with metal wire; ball graining using the combination of abrasive ball and abrasive material; and brush graining using nylon brush and abrasive agent. Such surface-graining methods may be used alone or in combination.

Of the above-mentioned methods for roughening the aluminum surface to a predetermined extent, the electrochemical surface-graining in an electrolytic solution of hydrochloric acid or nitric acid is particularly effective in the present invention. In this case, the electrical charge is suitably in the range of from 100 to 400 C/dm$^2$. More specifically, the aluminum substrate may be placed in an electrolytic solution containing 0.1 to 50% of hydrochloric acid or nitric acid and electrolysis may be carried out at a temperature of from 20 to 100° C. for one second to 30 minutes with the electrical charge controlled to 100 to 400 C/dm$^2$.

The aluminum substrate grained in the above-mentioned manner may be subjected to chemical etching with acids or alkalis. The use of alkalis for an etchant is advantageous for industrial applications because the time required to destroy the fine structure can be curtailed when compared with the use of acids. Preferable examples of the alkalis for use in etching are sodium hydroxide, sodium carbonate, sodium aluminate, sodium metasilicate, sodium phosphate, potassium hydroxide and lithium hydroxide. It is preferable to control the concentration of the alkali in the etchant to 1 to 50% and the temperature of the etchant to 20 to 100° C. so that the amount of aluminum to be dissolved in the etchant is in the range of from 5 to 20 g/m$^3$.

The etched aluminum surface may be then subjected to pickling for removing smut remaining on the etched surface. For pickling, nitric acid, sulfuric acid, phosphoric acid, chromic acid, hydrofluoric acid, fluoroboric acid are preferably employed. In particular, after the electrochemical surface-graining, a method to bring the etched aluminum surface into contact with a 15–65 wt % sulfuric acid solution at a temperature of from 50 to 90° C. as disclosed in J.P. KOKAI No. Sho 53-12739 is one of the preferable methods for removal of the smut after etching. The alkali etching method as described in J.P. KOKOKU No. Sho 48-28123 is also desirable.

Consequently, the Al substrate for use in the present invention is suitably finished to have a surface roughness of 0.3 to 0.7 µm in terms of (Ra).

(Anodization)

Further, the aluminum surface thus treated is then subjected to anodization. The anodization may be conducted in accordance with the methods well known in this field. More specifically, a direct current or alternating current is applied to the aluminum substrate in an aqueous solution or non-aqueous solution of hydrochloric acid, sulfuric acid, phosphoric acid, nitric acid, chromic acid, boric acid, oxalic acid, sulfamic acid, benzenesulfonic acid, or mixtures thereof, so that an anodized layer is deposited on the surface of the aluminum substrate.

The anodizing conditions cannot be definitely determined because the conditions vary depending upon the electrolytic solution to be employed. It is generally proper that the concentration of the electrolytic solution ranges from 1 to 80%, the liquid temperature ranges from 5 to 70° C., the current density be controlled to 0.5 to 60 A/dm$^2$, the applied voltage be in the range of 1 to 100 V, and the time for electrolysis be 10 to 100 sec.

One of the preferable anodizing methods is described in British Patent No. 1,412,768 where anodization is conducted in sulfuric acid at high current density, and the other method is to use an electrolytic bath of phosphoric acid as disclosed in U.S. Pat. No. 3,511,661.

In the present invention, it is preferable that the anodized layer deposited on the aluminum substrate by anodization has a thickness of 1 to 10 g/m$^2$, more preferably 1.5 to 7 g/m$^2$, and further preferably 2 to 5 g/m$^2$. When the thickness of the above-mentioned anodized layer is less than 1 g/m$^2$, the resultant PS plate may be susceptible to scratches, while extremely large amount of electric power is required to produce the anodized layer with a thickness of more than 10 g/m$^2$.

Furthermore, after surface-graining and anodization, the aluminum substrate may be subjected to sealing. For sealing, the aluminum substrate is immersed into hot water or a hot aqueous solution of an inorganic or organic salt, or placed in a steam bath. The aluminum surface may be subjected to still another surface treatment such as silicate treatment using silicates of alkali metals, or immersion in an aqueous solution of potassium fluorozirconate or phosphate.

In addition to the above-mentioned aluminum substrates, other plate-shaped materials with dimensional stability can also be used as the substrates for the PS plate. Examples of such dimensionally stable plate-shaped materials include paper, laminate sheets of paper with plastics such as polyethylene, polypropylene and polystyrene, metal plates such as zinc and copper plates, plastic films such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal films, and a sheet of paper or a plastic film to which the above-mentioned metal plates such as zinc and copper plates are attached or on which those metals are deposited.

Such substrates are preferably subjected to surface treatment to make the surface hydrophilic according to the nature of each substrate. The surface can be made hydrophilic by treatments based on some chemical reactions, such as etching, oxidation, reduction, and sol-gel coating. Alternatively, particular compounds capable of being adsorbed by the surface of the substrate may be coated thereon. In the latter case, for example, organic compounds carrying a phosphorus atom-containing acidic groups, e.g., phosphoric acid, phosphonic acid and phosphinic acid, or organic silicone compounds effectively contained in an adhesive layer provided on the aluminum substrate as described in J.P. KOKAI No. 2001-109139 are preferably used for the anodized aluminum substrates.

The PS plate for use in the present invention can be produced by providing the light-sensitive layer on the substrate.

The PS plate may further comprise an organic or inorganic undercoating layer that is interposed between the substrate and the light-sensitive layer.

(Oxygen Barrier Layer)

Furthermore, the PS plate for use in the present invention may further comprise a protective layer such as an oxygen barrier layer comprising a water-soluble vinyl polymer as the main component that is overlaid on the light-sensitive layer.

Examples of the water-soluble vinyl polymers for use in the oxygen barrier protection layer include a polyvinyl alcohol which may be partially substituted with ester, ether and acetal; and a copolymer comprising such a partially substituted vinyl alcohol unit and an unsubstituted vinyl alcohol unit in such a substantial amount that can impart the required water-solubility to the resultant copolymer. In the protection layer, polyvinyl alcohols hydrolyzed to the extent of 71 to 100% and have a degree of polymerization of 300 to 2400 are preferably used. Specific examples of the commercially available polyvinyl alcohol products are PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-220, PVA-224, PVA-217EE, PVA-217E, PVA-220E, PVA-224E, PVA-405, PVA-420, PVA-613, and L-8, which are made by KURARAY Co., Ltd. Examples of the above-mentioned copolymers preferably used in the oxygen barrier protection layer include polyvinyl acetate chloroacetate or propionate, polyvinyl formal, polyvinyl acetal and copolymer thereof, which are preferably hydrolyzed to the extent of 88 to 100%. In addition to the above, polyvinyl pyrrolidone, gelatin, and gum arabic are also effectively used for the oxygen barrier protection layer. These polymers may be used alone or in combination.

When the oxygen barrier protection layer is provided by coating, purified water is preferably used alone as a solvent, or in combination with alcohols such as methanol and ethanol, and ketones such as acetone and methyl ethyl ketone. It is proper that the solid content in the coating liquid for formation of the oxygen barrier protection layer be in the range of 1 to 20% by weight.

The oxygen barrier protection layer may further comprise known additives such as a surfactant for improving the coating characteristics and a water-soluble plasticizer for enhancing the physical properties of the obtained layer.

Examples of the above-mentioned water-soluble plasticizer include propionamide, cyclohexanediol, glycerin, and sorbitol. Water-soluble (meth)acrylic polymers may be added.

The coating amount for the oxygen barrier protection layer is suitably in the range of about 0.1 to about 15 g/m$^2$, preferably in the range of about 1.0 to about 5.0 g/m$^2$ after being dried.

[Process for Making the Lithographic Printing Plate]

The PS plate may be entirely heated, if required, prior to light exposure, during light exposure, or from the initiation of light exposure to termination of development. Heating of the PS plate as mentioned above can accelerate the reaction for image formation in the light-sensitive layer, thereby improving the sensitivity and the printing durability and also stabilizing the sensitivity. After termination of the development, it is also effective to subject the images obtained by development to entire heating or entire light exposure for improving the strength of obtained images and the printing durability. When the PS plate is heated before development, the PS plate is preferably heated under moderate conditions, more specifically, at 150° C. or less. When the PS plate is heated to extremely high temperatures, there will occur some problems, for example, fogging of non-image areas. When the PS plate is heated after development, the obtained images may be heated to high temperatures, generally in the range of 200 to 500° C. When the temperature is set within the above-mentioned range, the heating after development has an effect on strength of images without deterioration of the substrate and thermal decomposition of image areas.

Any light exposure methods well known in this field can be used in the present invention. Preferably used are light sources for laser beams. For example, the light sources for laser beams having wavelengths in the range of 350 to 450 nm are as follows:

gas laser such as Ar$^+$ laser (364 nm, 351 nm, 10 mW~1 W), Kr$^+$ laser (356 nm, 351 nm, 10 mW–1W), and He—Cd$^+$ laser (441 nm, 325 nm, 1 mW–100 mW);

solid state laser such as combination of Nd:YAG (YVO4) and SHG (355 nm, 5 mW–1W) and combination of Cr:LiSAF and SHG (430 nm, 10 mW);

semiconductor laser such as KNbO$_3$, ring resonator (430 nm, 30 mW), combination of waveguide optical wavelength conversion device, AlGaAs semiconductor and InGaAs semiconductor (380–450 nm, 5–100 mW), combination of waveguide optical wavelength conversion device, AlGaInP semiconductor and AlGaAs semiconductor (300–350 nm, 5–100 mW), and AlGaInN (350–450 nm, 5–30 mW); and pulse laser such as N$_2$ laser (337 nm, pulse: 0.1–10 mJ), and XeF (351 nm, pulse: 10–250 mJ).

In particular, AlGaInN semiconductor laser beams (commercially available as InGaN-based semiconductor laser beams with wavelengths of 400–410 nm and 5–30 mW) are preferable in terms of wavelength characteristics and cost.

As the light sources for laser beams having wavelengths of 450 to 700 nm, Ar$^+$ laser (488 nm), YAG-SHG laser (532 nm), He—Ne laser (633 nm), He—Cd laser, and red-color semiconductor laser (650–690 nm) are available. As the light sources for laser beams having wavelengths of 700 to 1200 nm, semiconductor laser (800–850 nm) and Nd-YAG laser (1064 nm) are preferably used.

In addition to the above, there can also be employed a variety of light sources such as ultrahigh pressure, high pressure, intermediate pressure and low pressure mercury lamps, chemical lamps, carbon arc lamps, xenon lamps, metal halide lamps, and ultraviolet laser lamps (ArF excimer laser, KrF excimer laser and the like). Further, radial rays such as electron beams, X-rays, ion beams and far infrared rays can also be used. In consideration of cost, the above-mentioned light sources for laser beams with wavelengths of 350 nm or more are particularly preferable.

Any light exposure mechanism, for example, internal drum exposure method, external drum exposure method, or flat bed method is applicable to the present invention.

The components constituting the light-sensitive layer of the PS plate can be made soluble in neutral water or weak alkaline aqueous solutions when those components have high water-solubility. This type of PS plate can be mounted on a printing machine for achieving the light exposure and development successively to make a lithographic printing plate.

After completion of development, the printing plate may be subjected to various kinds of after-treatment using rinsing water, surfactant-containing rinsings, and liquids for desensitization containing gum arabic and starch derivatives as disclosed in J.P. KOKAI Nos. Sho 54-8002, Sho. 55-115045 and Sho 59-58431. Such methods for after-treatment may be employed in combination in the present invention.

The lithographic printing plate thus obtained is set in an offset press to produce a large number of printed materials.

The developing behaviors will be detailed below.

[Rate of Development]

The "rate of development" used herein can be determined by immersing the PS plate described in Example 53 which will be detailed below in a variety of developers at 28° C. without subjecting the PS plate to any imagewise exposure to thus determine the time required for the removal of the light-sensitive layer and for the exposure of the underlying substrate and to determine the rate of development in terms of the change in the thickness of the light-sensitive layer under development. In this respect, the higher the rate of development, the higher and better the developing characteristics of a specific developer.

Rate of Developing Non-exposed area=[Thickness of Light-Sensitive Layer (μm)]/[Time Required for the Completion of Development(s)]

[Developer-Penetration Rate]

The "Developer-Penetration Rate" used herein can be determined by exposing, to light, the PS plate described in Example 53 which will be detailed below at a standard exposure value using various kinds of light sources for the exposure and then immersing the exposed PS plate in a variety of developers at 28° C. to thus determine changes in the electrostatic capacity of the developer. More specifically, the time required for the penetration of a developer into the light-sensitive layer and for bringing the substrate into contact with the developer is determined by examining the time required for undergoing any change in the electrostatic capacity (in case where it is difficult to detect any inflection point in the electrostatic capacity curve, the developer-penetration rate is evaluated by determining the time required till the electrostatic capacity reaches 100 nF). The developer-penetration rate in the direction along the thickness of the light-sensitive layer can be calculated on the basis of the time thus determined. In this respect, the smaller the developer-penetration rate, the lower the ability of the developer to penetrate into the light-sensitive layer and the better the quality of the developer.

Figure 2:
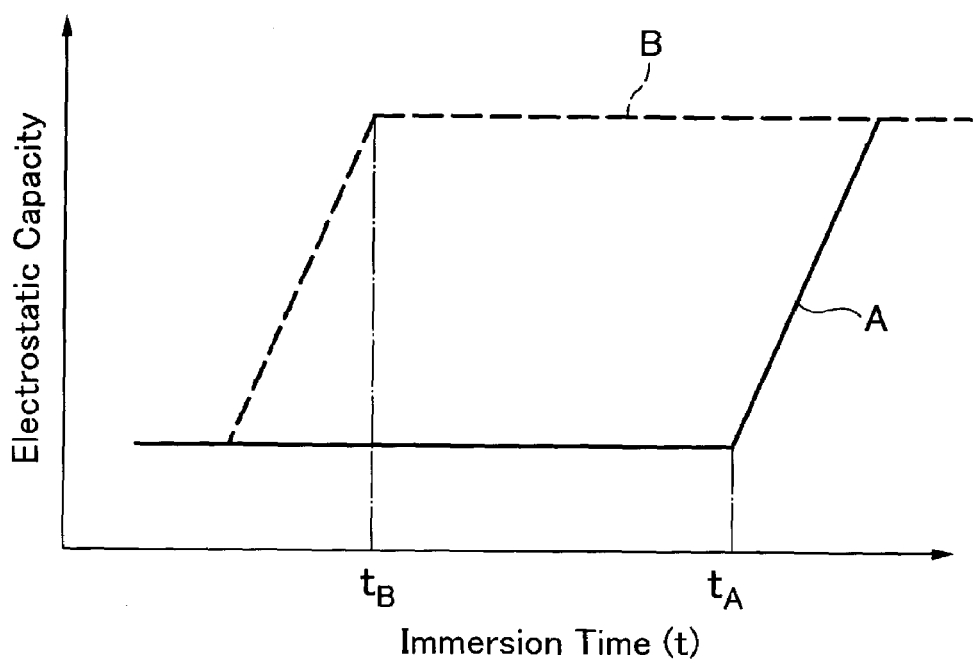
FIG. 2 shows schematically a graph on which results obtained by the device for determining a developer-penetration rate are plotted.

In this connection, a device for determining the developer-penetration rate and a graph on which the results obtained are plotted are shown schematically in FIG. 1 and FIG. 2, respectively.

Rate of Developer-Penetration into Exposed Area= [Thickness of Light-Sensitive Layer (μm)]/ [Time (s) at Which the Electrostatic Capacity Undergoes a Change]

[Dissolution and Swelling of Light-Sensitive Layer]

The "dissolution (solubilization) and swelling of light-sensitive layer" used herein is determined by immersing the PS plate described in Example 53 which will be detailed below in a variety of developers at 30° C. without subjecting the PS plate to any imagewise exposure and then examining the dissolution behavior of the light-sensitive layer using a DRM interference wave-measuring device. In case where the development is successively taken place from the surface of the light-sensitive layer without causing any swelling of the layer, the thickness of the light-sensitive layer is gradually reduced with the elapse of time and this results in the generation of an interference wave, which varies depending on the thickness of the light-sensitive layer. Contrary to this, in case of the development accompanied by swelling of the light-sensitive layer (dissolution with the removal of the layer), there is not observed any clear interference wave because of changes in the thickness of the layer through the penetration of the developer into the layer.

It is desirable that clear interference waves are formed and the dissolution and swelling of light-sensitive layer is herein evaluated on the basis of the presence of an interference wave.

Figure 3:
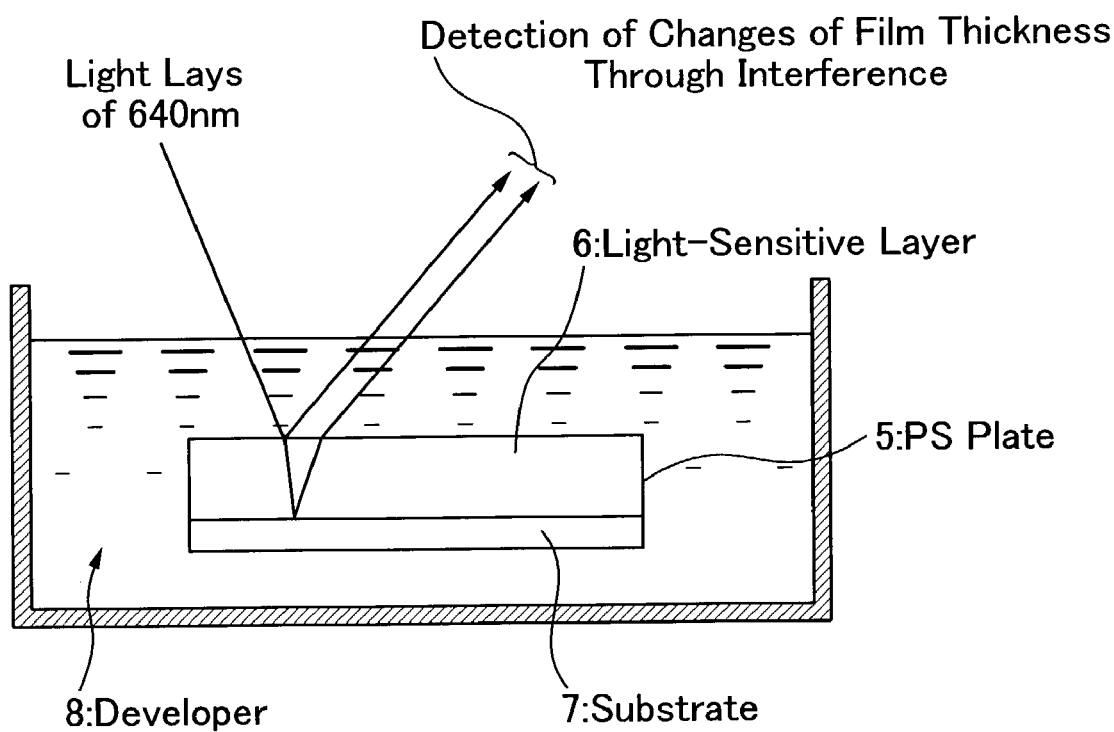
FIG. 3 shows schematically a DRM interference wave-measuring device used in determination of dissolution and swelling of light-sensitive layer.
Figure 4A:
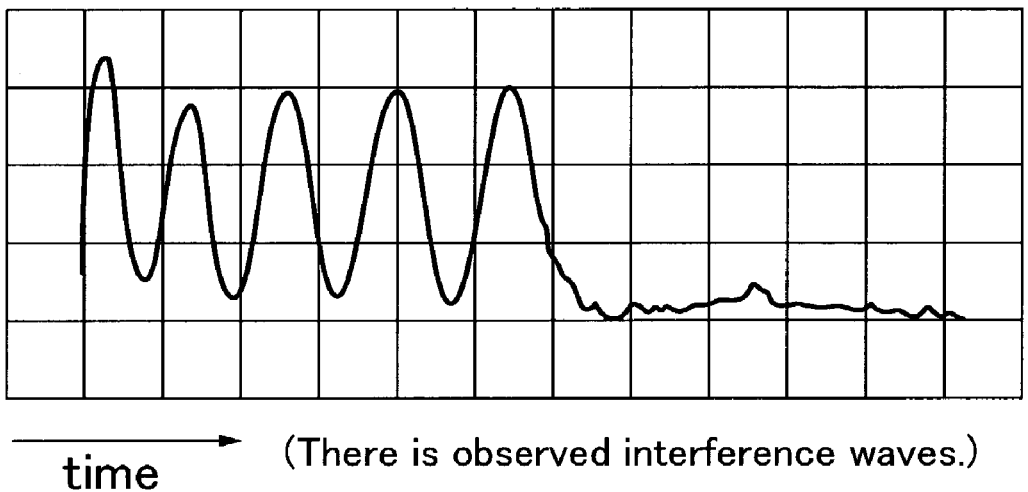
FIG. 4A shows the results on interference waves determined by the DRM interference wave-measuring device, in case of the invention.
Figure 4B:
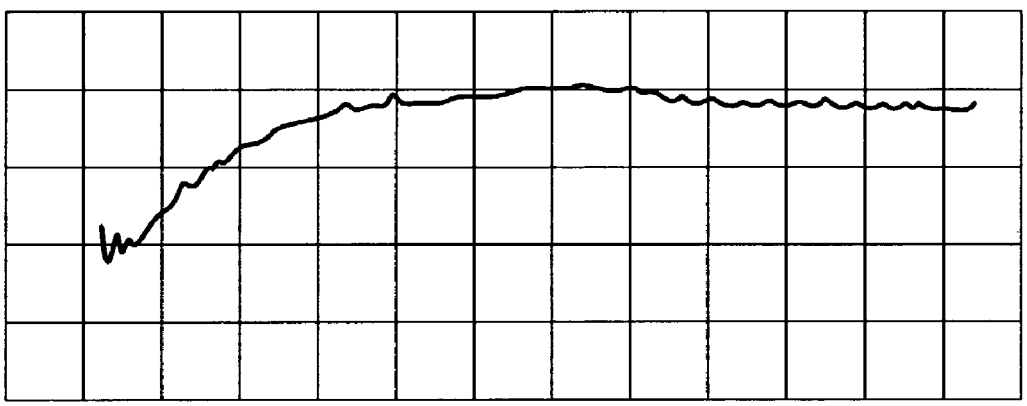
FIG. 4B shows the results on interference waves determined by the DRM interference wave-measuring device, in case of a conventional technique.

In this respect, a DRM interference wave-measuring device used in the determination of the dissolution and swelling of light-sensitive layer and the results determined are shown schematically in FIG. 3 and FIG. 4, respectively.

The developer for a photopolymerizable PS plate according to the present invention (hereinafter possibly referred to as simply "developer") will be explained below.

The developer according to the present invention is fundamentally an alkaline aqueous solution comprising at least an alkali silicate and the nonionic compound represented by the formula (I). In the developer according to the present invention, a molar ratio of $SiO_2/M_2O$ is suitably adjusted between 0.75 and 4.0. The alkali silicate is usually used in combination with a base, and the developer's pH ranges from 11.5 to 12.8, and preferably from 11.8 to 12.5.

The alkali silicate used in the developer of the present invention includes those showing an alkalinity when dissolved in water, for example, sodium silicate, potassium silicate, lithium silicate and ammonium silicate. Such alkali silicate may be used alone or in combination.

The developing performance of the alkaline aqueous solution may be easily modulated by adjusting a mixing ratio of silicon oxide ($SiO_2$) and an alkali oxide ($M_2O$, wherein M represents an alkali metal or an ammonium group) which are components of the alkali silicate, and concentrations thereof. In the developer according to the present invention, a molar ratio of $SiO_2/M_2O$ is suitably adjusted between 0.75 and 4.0, and preferably between 1.0 and 3.0. If the molar ratio, $SiO_2/M_2O$ is less than 0.75, the alkalinity of the solution will increase and possibly cause a harmful effect such as etching of an aluminum plate which is generally used as a substrate of a PS plate. If the molar ratio, $SiO_2/M_2O$ is more than 3.0, the developing performance of the solution may possibly be degraded.

The concentration of alkali silicate in the developer ranges generally from 0.1 to 3% by weight in terms of the amount of silicon dioxide ($SiO_2$), and preferably from 0.5 to 2% by weight. If said concentration is less than 0.1% by weight, the developing performance or treatment capacity may be degraded. If said concentration is more than 3% by weight, precipitates or crystals may be easily generated, and gelation may be easily caused during neutralization of waste liquid, resulting in an obstacle to the waste disposal.

The base which is used in combination with the alkali silicate may be selected from known alkaline agents which are conventionally used in a developer.

Examples of the alkaline agents include inorganic alkaline agents such as sodium hydroxide, potassium hydroxide, lithium hydroxide, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium bicarbonate, potassium bicarbonate, ammonium bicarbonate, sodium borate, potassium borate and ammonium borate, and potassium citrate, sodium citrate and the like. Preferable combination use of the above alkaline agents is a combination of an alkali metal hydroxide such as sodium hydroxide and potassium hydroxide with a carbonate such as sodium carbonate and potassium carbonate.

The alkaline agents which are usable also include organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, tetramethylammonium hydroxide and the like.

The above alkaline agent may be used alone or in combination.

Among these alkaline agents, preferred are sodium hydroxide and potassium hydroxide. Further, sodium tertiary phosphate, potassium tertiary phosphate, sodium carbonate and potassium carbonate are also preferable, since they have themselves, buffering action.

[Nonionic Compound Represented by the Formula (I)]

The developer according to the present invention further comprises a nonionic compound represented by the following general formula (I).

$$A-W \quad (I)$$

wherein, A represents a hydrophobic organic group whose log P as determined for A–H is not less than 1.5 and W represents a nonionic hydrophilic organic group whose log P as determined for W–H is less than 1.0).

Log P is generally used as a hydrophobic property parameter, which is described in C. Hansch, A. Leo, "Substituent Constants for Correlation Analysis in Chemistry and Biology", J. Wile & Sons, 1979. Log P is determined as follows: the object molecule (A–H and W–H) is distributed in a two-layers system of octanol/water at (25° C.) to obtain a proportion of partition between octanol layer and water layer, a balanced concentration ratio P is calculated from said proportion, and log P is defined as a logarithmic value of said balanced concentration ratio P.

Log P herein is used as an index which identifies each of groups A and W. Log P herein denotes those obtained from the known data by calculation according to the method described in A. K. Ghose, et. Al. J. Comput. Chem. 9, 80 (1988), on the basis of A–H or W–H structure, which structure is made by linking hydrogen atom to each of the organic groups A and W, for the sake of simplicity.

Specifically, as a chemical structure of A and W, organic groups A and W are usually different from each other, and each of A and W represents a monovalent organic residue which satisfies the above definite log P value. More preferably, each of A and W represents a hydrogen atom, a halogen atom, a hydrocarbon radical which may have a substituent and/or an unsaturated bond, a heterocyclic group, a hydroxyl group, a substituted oxy group, a mercapto group, a substituted thio group, an amino group, a substituted amino group, a substituted carbonyl group, a carboxylate group, a sulfo group, a sulfonato group, a substituted sulfinyl group, a substituted sulfonyl group, a phosphono group, a substituted phosphono group, a phosphonato group, a substituted phosphonato group, a cyano group, a nitro group and the like.

Said hydrocarbon radical which may have a substituent and/or a unsaturated bond includes an alkyl group, a substituted alkyl group, an aryl group, a substituted aryl group, an alkenyl group, a substituted alkenyl group, an alkynyl group, a substituted alkynyl group and the like.

Said alkyl group includes a linear chain, branched chain or cyclic alkyl group having carbon atoms of from 1 to 20, specific examples thereof are methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-metylbutyl, isohexyl, 2-ethylhexyl, 2-methylhexyl, cyclohexyl, cyclopentyl and 2-norbornyl groups and the like. Among these, preferred are a linear chain alkyl group having 1 to 12 carbon atoms, a branched chain alkyl group having 3 to 12 carbon atoms, and a cyclic alkyl group having 5 to 10 carbon atoms.

Said substituted alkyl group consists in a linkage of a substituent group and an alkylene group, and said substituent group includes a monovalent non-metallic atomic group other than a hydrogen atom. Preferred examples of the substituent group are halogen atoms (—F, —Br, —Cl and —I), hydroxyl, alkoxy, aryloxy, mercapto, alkylthio, arylthio, alkyldithio, aryldithio, amino, N-alkylamino, N,N-dialkylamino, N-arylamino, N,N-diarylamino, N-alkyl-N-arylamino, acyloxy, carbamoyloxy, N-alkylcarbanoyloxy, N-arylcarbamoyloxy, N,N-dialkylcarbamoyloxy, N,N-diarylcarbamoyloxy, N-alkyl-N-arylcarbamoyloxy, alkylsulfoxy, arylsulfoxy, acylthio, aminoacyl, N-alkylacylamino, N-arylacylamino, ureido, N'-alkylureido, N',N'-dialkylureido, N'-arylureido, N',N'-diarylureido, N'-alkyl-N'-arylureido, N-alkylureido, N-arylureido, N'-alkyl-N-alkylureido, N'-alkyl-N-arylureido, N',N'-dialkyl-N-alkylureido, N',N'-dialkyl-N-arylureido, N'-aryl-N-alkylureido, N'-aryl-N-arylureido, N',N'-diaryl-N-alkylureido, N',N'-diaryl-N-arylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycarbonylamino, N-aryl-N-alkoxycarbonylamino, N-aryl-N-aryloxycarbonylamino, formyl, acyl, carboxyl group and conjugate base group thereof (hereinafter referred to as carboxylate), alkoxycarbonyl, aryloxycarbonyl, carbamoyl, N-alkylcarbomoyl, N,N-dialkylcarbamoyl, N-arylcarbamoyl, N,N-diarylcarbamoyl, N-alkyl-N-arylcarbamoyl, alkylsulfinyl, arylsulfinyl, arylsulfonyl, sulfo (—SO$_3$H) and conjugate base group thereof (hereinafter referred to as sulfonato), alkoxysulfonyl, aryloxysulfonyl, sulfinamoyl, N-alkylsulfinamoyl, N,N-diarylsulfinamoyl, N-arylsufinamoyl, N,N-diarylsulfinamoyl, N-alkyl-N-arylsulfinamoyl, sulfamoyl N-alkylsulfamoyl, N,N-dialkylsulfamoyl, N-arylsulfamoyl, N,N-diarylsulfamoyl, N-alkyl-N-arylsulfamoyl, N-acylsulfamoyl and conjugate base group thereof, N-alkylsulfonylsulfamoyl (—SO$_2$NHSO$_2$(alkyl)) and conjugate base group thereof, N-arylsulfonylsulfamoyl (—SO$_2$NHSO$_2$(aryl)) and conjugate base group thereof, N-alkylsulfonylcarbamoyl (—CONHSO$_2$(alkyl)) and conjugate base group thereof, N-arylsulfonylcarbamoyl (—CONHSO$_2$(aryl)) and conjugate base group thereof, alkoxysilyl (—Si(O-alkyl)$_3$), aryloxysilyl (—Si(O-aryl)$_3$), hydroxysilyl (—Si(OH)$_3$) and conjugate base group thereof, phosphono (—PO$_3$H$_2$) and conjugate base group thereof (hereinafter referred to as phosphonato), dialkylphosphono (—PO$_3$(alkyl)$_2$), diarylphosphono (—PO$_3$(aryl)$_2$), alkylarylphosphono (—PO$_3$(alkyl)(aryl)), monoalkylphosphono (—PO$_3$H(alkyl)) and conjugate base group thereof (hereinafter referred to as alkylphosphonato), monoarylphosphono (—PO$_3$H(aryl)) and conjugate base group thereof (hereinafter referred to as arylphosphonato), phosphonoxy (—OPO$_3$H$_2$) and conjugate base group thereof (hereinafter referred to as phosphonatoxy), dialkylphosphonoxy (—OPO$_3$(alkyl)$_2$) diarylphosphonoxy (—OPO$_3$(aryl)$_2$), alkylarylphosphonoxy (—OPO$_3$(alkyl)(aryl)), monoalkylphosphonoxy (—OPO$_3$H(alkyl)) and conjugate base group thereof (hereinafter referred to as alkylphosphonatoxy), monoarylphosphonoxy (—OPO$_3$H(aryl)) and conjugate base group thereof (hereinafter referred to as arylphosphonatoxy), cyano, nitro, aryl, alkenyl and alkynyl groups and the like.

Said alkyl group on the above substituent includes alkyl groups as described above. Specific examples of the aryl group on the above substituent are phenyl, biphenyl, naphthyl, tolyl, xylyl, mesityl, cumenyl, fluorophenyl, chlorophenyl, bromophenyl, chloromethylphenyl, hydroxyphenyl, methoxyphenyl, ethoxyphenyl, phenoxyphenyl, acetoxyphenyl, benzoyloxyphenyl, methylthiophenyl, phenylthiophenyl, methylaminophenyl, dimethylaminophenyl, acetylaminophenyl, carboxyphenyl, methoxycarbonylphenyl, ethoxycarbonylphenyl, phenoxycarbonylphenyl, N-phenylcarbamoylphenyl, phenyl, nitrophenyl, cyanophenyl, sulfophenyl, sulfonatophenyl, phosphonophenyl and phosphonatophenyl groups. Specific examples of the alkenyl group are vinyl, 1-propenyl, 1-butenyl, cinnamyl and 2-chloro-1-ethenyl groups and the like. Specific examples of the alkynyl group are ethynyl, 1-propynyl, 1-butynyl, trimethylsilylethynyl and phenylethynyl groups and the like.

Said acyl group ($R^4CO$—) includes those wherein $R^4$ is hydrogen atom, the above described alkyl, aryl, alkenyl or alkynyl group.

The alkylene group in the substituted alkyl group includes a bivalent organic residue which is shown by excepting any one hydrogen atom on the above mentioned alkyl group having carbon atoms of from 1 to 20, and preferred are a linear chain alkylene group having carbon atoms of from 1 to 12, a branched chain alkylene group having carbon atoms of from 3 to 12 and a cyclic alkylene group having carbon atoms of from 5 to 10.

Examples of the preferred substituted alkyl group are chloromethyl, bromomethyl, 2-chloroethyl, trifluoromethyl, methoxymethyl, methoxyethyoxyethyl, allyloxymethyl, phenoxymethyl, methylthiomethyl, tolylthiomethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-methylbenzoylaminopropyl, 2-oxoethyl, 2-oxopropyl, carboxypropyl, methoxycarbonylethyl, methoxycarbonylmethyl, methoxycarbonybutyl, ethoxycarbonylmethyl, butoxycarbonylmethyl, allyloxycarbonylmethyl, benzyloxycarbonylmethyl, methoxycarbonylphenylmethyl, trichloromethylcarbonylmethyl, allyloxycarbonylbutyl, chlorophenoxycarbonylmethyl, carbamoylmethyl, N-methylcarbamoylethyl, N,N-dipropylcarbamoylmethyl, N-(methoxyphenyl)carbamoylethyl, N-methyl-N-(sulfophenyl)carbamoylmethyl, sulfopropyl, sulfobutyl, sulfonatobutyl, sulfamoylbutyl, N-ethylsulfamoylmethyl, N,N-dipropylsulfamoylpropyl, N-tolylsulfamoylpropyl, N-methyl-N-(phosphonophenyl)sulfamoyloctyl,

CH$_3$CONHSO$_2$CH$_2$CH$_2$CH$_2$CH$_2$—,

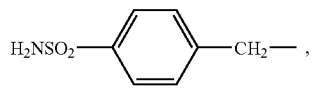

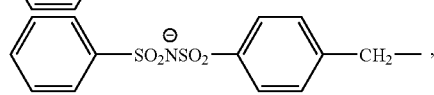

phosphonobutyl, phosphonatohexyl, diethylphosphonobutyl, diphenylphosphonopropyl, methylphosphonobutyl, methylphosphonato butyl, tolylphosphonohexyl, tolylphosphonato hexyl, phosphonoxypropyl, phosphonatoxybutyl, benzyl, phenethyl, α-methylbenzyl, 1-methyl-1-phenylethyl, p-methylbenzyl, cinnamyl, allyl, 1-propenylmethyl, 2-butenyl, 2-methylallyl, 2-methylpropenylmethyl, 2-propynyl, 2-butynyl and 3-butynyl groups and the like.

The aryl group includes a monocyclic group and a condensed-ring group such as those are formed from condensation of from 1 to 3 benzene rings, condensation of a benzene ring and five-membered unsaturated ring, and the like. Examples of the aryl group are phenyl, naphthyl, anthryl, phenanthryl, indenyl, acenaphthenyl and fluorenyl groups and the like. Among these, phenyl and naphthyl groups are preferable.

Said substituted aryl group consists of binding of a substituent group to an aryl group. As a substituent group bonding to a carbon atom which is a ring-forming member of the aryl group, a monovalent non-metallic atomic group other than a hydrogen atom is exemplified. Preferred examples of the substituent group include the alkyl groups, the substituted alkyl groups and the substituent groups on the substituted alkyl groups as described above. Specific examples of preferred substituted aryl group are biphenyl, tolyl, xylyl, mesityl, cumenyl, chlorophenyl, bromophenyl, fluorophenyl, chloromethylphenyl, trifluoromethylphenyl, hydroxyphenyl, methoxyphenyl, methoxyethoxyphenyl, allyloxyphenyl, phenoxyphenyl, methylthiophenyl, tolylthiophenyl, phenylthiophenyl, ethylaminophenyl, diethylaminophenyl, morpholinophenyl, acetyloxyphenyl, benzoyloxyphenyl, N-cyclohexylcarbamoyloxyphenyl, N-phenylcarbamoyloxyphenyl, acetylaminophenyl, N-methylbenzoylaminophenyl, carboxyphenyl, methoxycarbonylphenyl, allyloxycarbonylphenyl, chlorophenoxycarbonylphenyl, carbamoylphenyl, N-methylcarbamoylphenyl, N,N-dipropylcarbamoylphenyl, N-(methoxyphenyl)carbamoylphenyl, N-methyl-N-(sulfophenyl)carbamoylphenyl, sulfophenyl, sulfonato phenyl, sulfamoylphenyl, N-ethylsulfamoylphenyl, N,N-dipropylsulfamoylphenyl, N-tolylsulfamoylphenyl, N-methyl-N-(phosphonophenyl)sulfamoylphenyl, phosphonophenyl, phosphonato phenyl, diethylphosphonophenyl, diphenylphosphonophenyl, methylphosphonophenyl, methylphosphonato phenyl, tolylphosphonophenyl, tolylphosphonato phenyl, allylphenyl, 1-propenylmethylphenyl, 2-butenylphenyl, 2-methylallylphenyl, 2-methylpropenylphenyl, 2-propynylphenyl, 2-butynylphenyl and 3-butynylphenyl groups and the like.

The alkenyl group includes those described above. The substituted alkenyl group consists of replacing a hydrogen atom in the alkenyl group with a substituent group which bonds thereto. The substituent group includes the groups which are described above as substituents on the substituted alkyl group, and the alkenyl group includes those described above. Specific examples of preferred substituted alkenyl group are shown below.

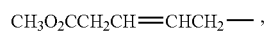

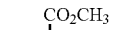
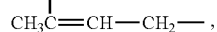

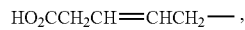

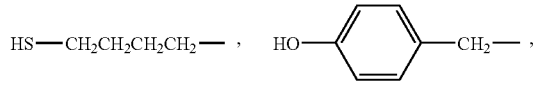

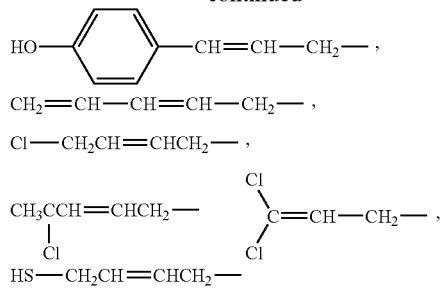

The alkynyl group includes those described above. The substituted alkynyl group consists of replacing a hydrogen atom in the alkynyl group with a substituent group which bonds thereto. The substituent group includes the groups which are described above as substituents on the substituted alkyl group, and the alkynyl group includes those described above.

The heterocyclic group includes a monovalent group which is shown by excepting any one hydrogen atom on a heterocycle, and a monovalent group which is shown by excepting any one hydrogen atom on the above monovalent group and linking thereto a substituent group which is described above as a substituent group in the substituted alkyl group, such monovalent group being referred to as a substituted heterocyclic group. Specific examples of preferred heterocyclic group are shown below.

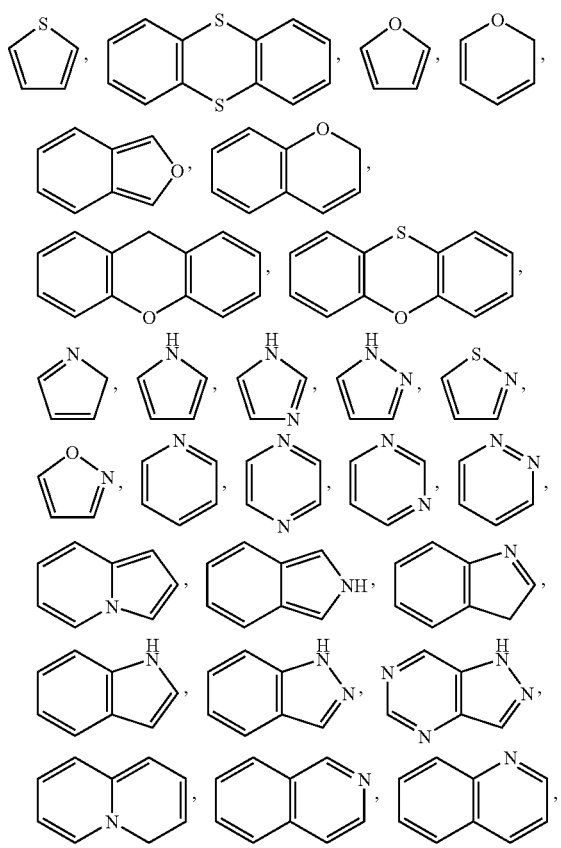

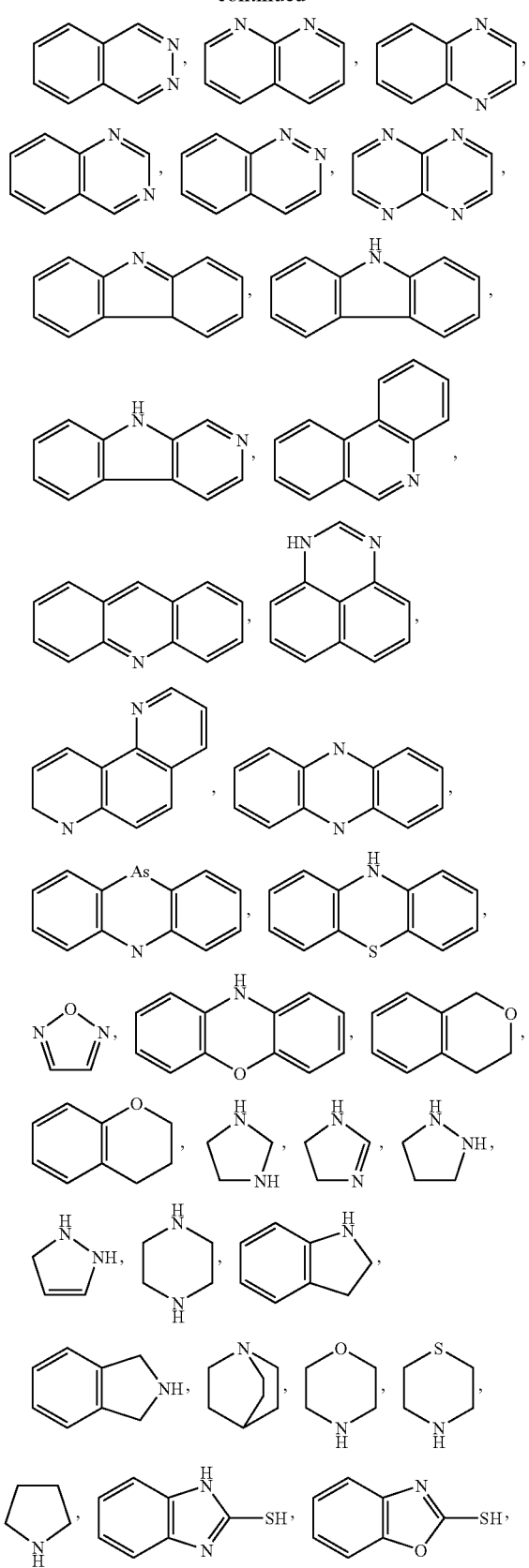

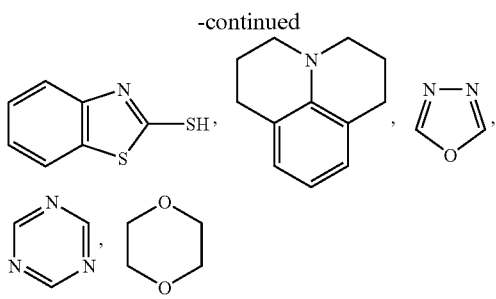

The substituted oxy group (R⁵O—) includes those wherein R⁵ is a monovalent non-metallic atomic group other than a hydrogen atom. Preferred substituted oxy group includes alkoxy, aryloxy, acyloxy, carbamoyloxy, N-alkylcarbamoyloxy, N-arylcarbamoyloxy, N,N-dialkylcarbamoyloxy, N,N-diarylcarbamoyloxy, N-alkyl-N-arylcarbamoyloxy, alkylsulfoxy, arylsulfoxy, phosphonoxy and phosphonato oxy groups and the like. The alkyl group and the aryl group in the above oxy group may be the above mentioned alkyl, substituted alkyl, aryl and substituted aryl groups.

The acyl group (R⁶CO—) in said acyloxy group includes those wherein R⁶ is the above mentioned alkyl, substituted alkyl, aryl and substituted aryl groups. Preferable substituent groups in the above group are alkoxy, aryloxy, acyloxy and arylsulfoxy groups and the like. Specific examples of preferred substituted oxy group are methoxy, ethoxy, propyloxy, isopropyloxy, butyloxy, pentyloxy, hexyloxy, dodecyloxy, benzyloxy, allyloxy, phenethyloxy, carboxyethyloxy, methoxycarbonylethyloxy, ethoxycarbonylethyloxy, methoxyethoxy, phenoxyethoxy, methoxyethoxyethoxy, ethoxyethoxyethyoxy, morpholinoethoxy, morpholinoethoxy, morpholinopropyloxy, allyloxyethoxyethoxy, phenoxy, tolyloxy, xylyloxy, mesityloxy, cumenyloxy, methoxyphenyloxy, ethoxyphenyloxy, chlorophenyloxy, bromophenyloxy, acetyloxy, benzoyloxy, naphthyloxy, phenylsulfonyloxy, phosphonoxy and phosphonato oxy groups and the like.

The substituted thio group (R⁷S—) includes those wherein R⁷ is a monovalent non-metallic atomic group other than a hydrogen atom. Preferable substituted thio groups are alkylthio, arylthio, alkyldithio, aryldithio and acylthio groups and the like. The alkyl and aryl groups in the above thio group include the above mentioned alkyl, substituted alkyl, aryl and substituted aryl groups, and the acyl group (R⁶CO—) in the above acylthio group is as described above. Among these, alkylthio and aryl thio groups are preferable. Specific examples of preferred substituted thio groups are methylthio, ethylthio, phenylthio, ethoxyethylthio, carboxyethylthio and methoxycarbonylthio groups and the like.

The substituted amino group (R⁸NH—, (R⁹)(R¹⁰)N—) includes those wherein R⁸, R⁹, R¹⁰ are a monovalent non-metallic atomic group other than a hydrogen atom. Preferable examples of the substituted amino group are N-alkylamino, N,N-dialkylamino, N-arylamino, N,N-diarylamino, N-alkyl-N-arylamino, acylamino, N-alkylacylamino, N-arylacylamino, ureido, N'-alkylureido, N',N'-dialkylureido, N'-arylureido, N',N'-diarylureido, N'-alkyl-N'-arylureido, N-alkylureido, N-arylureido, N'-alkyl-N-alkylureido, N'-alkyl-N-arylureido, N'-N'-dialkyl-N-alkylureido, N',N'-dialkyl-N-arylureido, N'-aryl-N-alkylureido, N'-aryl-N-arylureido, N',N'-diaryl-N-alkylureido, N',N'-diaryl-N-arylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycarbonylamino, N-aryl-N-alkoxycarbonylamino, N-aryl-N-aryloxycarbonylamino groups and the like. The alkyl and aryl groups in the above amino groups include the above mentioned alkyl, substituted alkyl, aryl and substituted aryl groups, and the acyl group (R⁶CO—) in the above acylamino, N-alkylacylamino and N-arylacylamino groups is as described above. Among these, more preferred are N-alkylamino, N,N-dialkylamino, N-arylamino and acylamino groups and the like. Specific examples of preferable substituted amino group are methylamino, ethylamino, diethylamino, morpholino, piperidino, phenylamino, benzoylamino and acetylamino groups and the like.

The substituted carbonyl group (R¹¹—CO—) includes those wherein R¹¹ is a monovalent non-metallic atomic group. Examples of the substituted carbonyl group are formyl, acyl, carboxyl, alkoxycarbonyl, aryloxycarbonyl, carbamoyl, N-alkylcarbamoyl, N,N-dialkylcarbamoyl, N-arylcarbamoyl, N,N-diarylcarbamoyl and N-alkyl-N-arylcarbamoyl groups and the like. The alkyl and aryl groups in the above substituted carbonyl groups include the above mentioned alkyl, substituted alkyl, aryl and substituted aryl groups. Among these, preferable substituted carbonyl groups are formyl, acyl, carboxyl, alkoxycarbonyl, aryloxycarbonyl, carbamoyl, N-alkylcarbamoyl, N,N-dialkylcarbamoyl and N-arylcarbamoyl groups and the like, and more preferred are formyl, acyl, alkoxycarbonyl and aryloxycarbonyl groups and the like. Specific examples of the substituted carbonyl group are formyl, acetyl, benzoyl, carboxyl, methoxy carbonyl, allyloxycarbonyl, N-methylcarbamoyl, N-phenylcarbamoyl, N,N-diethylcarbamoyl and morpholinocarbonyl groups and the like.

The substituted sulfinyl group (R¹²—SO—) includes those wherein R¹² is a monovalent non-metallic atomic group. Examples of the substituted sulfinyl group are alkylsulfinyl, arylsulfinyl, sulfinamoyl, N-alkylsulfinamoyl, N,N-dialkylsulfinamoyl, N-arylsulfinamoyl, N,N-diarylsulfinamoyl, N-alkyl-N-arylsulfinamoyl and N-alkyl-N-arylsulfinamoyl groups and the like. The alkyl and aryl groups in the above substituted sulfinyl groups include the above mentioned alkyl, substituted alkyl, aryl and substituted aryl groups. Among these, preferable substituted sulfinyl groups are alkylsulfinyl and arylsulfinyl groups and the like. Specific examples of the substituted sulfinyl groups are hexylsulfinyl, benzylsulfinyl and tolylsulfinyl groups and the like.

The substituted sulfonyl group (R¹³—SO₂—) includes those wherein R¹³ is a monovalent non-metallic atomic group. Preferable examples of the substituted sulfonyl group are alkylsulfonyl and arylsulfonyl groups and the like. The alkyl and aryl groups in the above substituted sulfonyl group include the above mentioned alkyl, substituted alkyl, aryl and substituted aryl groups. Specific examples of the substituted sulfonyl group are butylsulfonyl and chlorophenylsulfonyl groups and the like.

The sulfonato group (—SO₃⁻) denotes a conjugate base anionic ion group of a sulfo group (—SO₃H) as described above, and normally the sulfonate group is preferably used with a counter cationic ion. Said counter cationic ion includes those generally known, for example, various oniums such as ammoniums, sulfoniums, phosphoniums, iodoniums, aziniums and the like, and metallic ions such as Na⁺, K⁺, Ca²⁺, Zn²⁺ and the like.

The carboxylate group (—CO₂⁻) denotes a conjugate base anionic ion groups of a carboxyl group (—CO₂H) as described above, and normally the carboxylate group is preferably used with a counter cationic ion. Said counter cationic ion includes those generally known, for example, various oniums such as ammoniums, sulfoniums, phosphoniums, iodoniums, aziniums and the like, and metallic ions such as $Na^+$, $K^+$, $Ca^{2+}$, $Zn^{2+}$ and the like.

The substituted phosphono group denotes a group consisting of replacing one or two hydroxyl groups in a phosphono group with an organic oxo group which differs from a hydroxyl group. Preferable examples of the substituted phosphono group are dialkylphosphono, diarylphosphono, alkylarylphosphono, monoalkylphosphono and monoarylphosphono groups and the like. The alkyl and aryl groups in the above substituted phosphono group include the above mentioned alkyl, substituted alkyl, aryl and substituted aryl groups. Among these, dialkylphosphono and diarylphosphono groups are preferable. Specific examples of these groups are diethylphosphono, dibutylphosphono, diphenylphosphono groups and the like.

The phosphonato group ($-PO_3^{2-}$, $-PO_3H^-$) denotes a conjugate base anionic ion groups derived from an acid first-dissociation or an acid second-dissociation of a phosphono group ($-PO_3H_2$) as described above. Normally the phosphonate group is preferably used with a counter cationic ion. Said counter cationic ion includes those generally known, for example, various oniums such as ammoniums, sulfoniums, phosphoniums, iodoniums, aziniums and the like, and metallic ions such as $Na^+$, $K^+$, $Ca^{2+}$, $Zn^{2+}$ and the like.

The substituted phosphonato group is a conjugate base anionic ion group of the above mentioned substituted phosphono group which consists of replacing one hydroxyl group in a phosphono group with an organic oxo group. Examples of the substiututed phosphonate group are a conjugate base of the above mentioned monoalkylphosphono group ($-PO_3H(alkyl)$) and monoarylphosphono group ($-PO_3H(aryl)$). Normally the substituted phosphonate group is preferably used with a counter cationic ion. Said counter cationic ion includes those generally known, for example, various oniums such as ammoniums, sulfoniums, phosphoniums, iodoniums, aziniums and the like, and metallic ions such as $Na^+$, $K^+$, $Ca^{2+}$, $Zn^{2+}$ and the like.

In the formula (I), structure of A is preferably an organic group comprising an aromatic group, and structure of W is preferably a nonionic organic group comprising a polyoxyalkylene group.

Examples of A–H and W–H are shown below.

EXAMPLES OF A–H

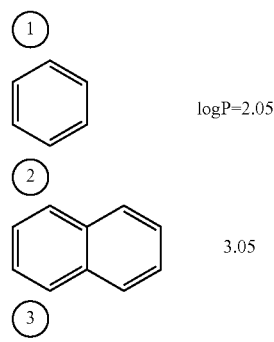

⑧ a linear or branched chain $C_nH_{2n+2}$ (n is an integer $\geq 4$) log P of 2.09 in case of butane
⑨ a linear or branched chain $C_nH_{2n}$ (n is an integer $\geq 4$)
⑩ a linear or branched chain $C_nH_{2n-2}$ (n is an integer $\geq 4$)

Any hydrogen atom on the above structures ①~⑩ may be replaced with the above described substituent group on the hydrocarbon radicals.

EXAMPLES OF W–H

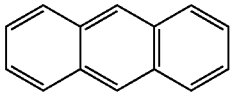

-continued
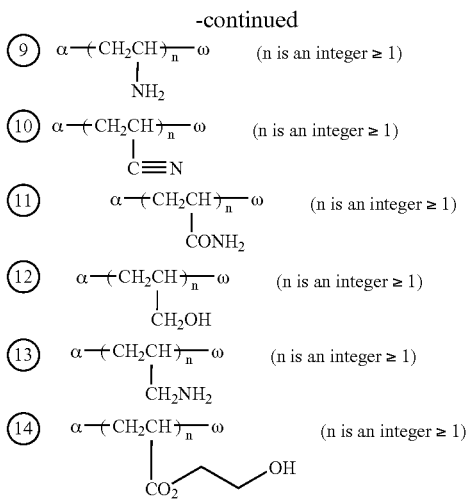
In the above ①~⑧, α and ω each represents —OH, —H, —SH or —NH$_2$. A hydrogen atom on the above structures ①~⑭ may be replaced with the above described substituent group on the hydrocarbon radicals.
Specific examples of the compound represented by the formula (I) are shown below.
[Examples of Compound represented by the Formula (I)]
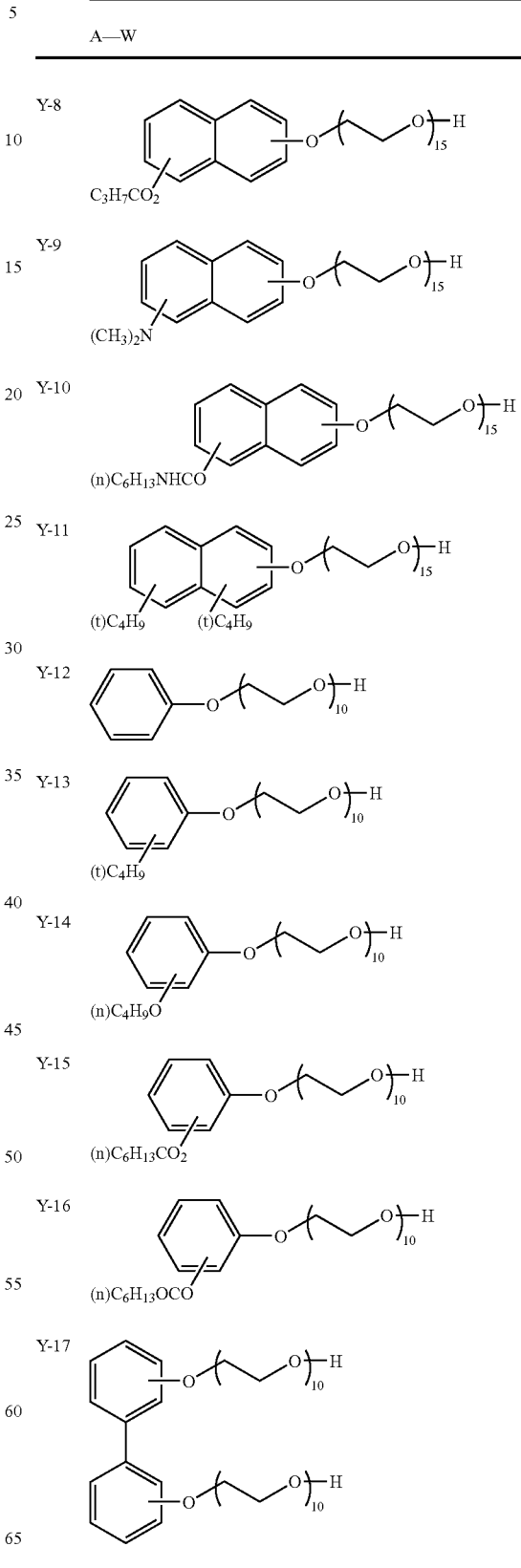

[Examples of Compound represented by the Formula (I)]

A—W

Y-18
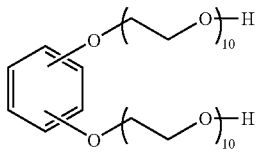

Y-19
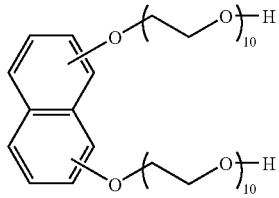

Y-20
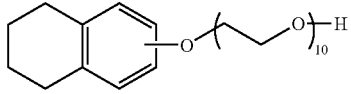

Y-21
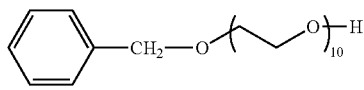

Y-22
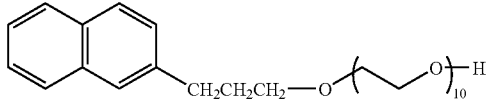

Preferred examples of the nonionic compound of the formula (I) include the compound represented by the following formula (I-A) or (I-B).

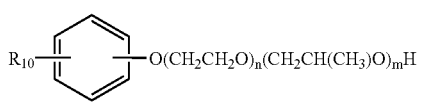 (I-A)

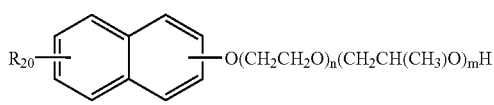 (I-B)

wherein $R_{10}$ and $R_{20}$ each represents H or a hydrocarbon group having 1 to 100 carbon atoms and n and m each represents an integer ranging from 0 to 100, provided that n and m are not simultaneously zero.

Examples of hydrocarbon group as $R_{10}$ and $R_{20}$ include alkyl group, aryl group, and aralkyl group, and groups comprising the alkyl group, aryl group and aralkyl group with ether bond, ester bond or amide bond.

More preferred examples of $R_{10}$ and $R_{20}$ include H or straight or branched alkyl group comprising 1 to 100 carbon atoms. In addition, each $R_{10}$ and $R_{20}$ may represent a group: $R_{30}$—X—, wherein $R_{30}$ is a straight or branched alkyl group having 1 to 100 carbon atoms, and X is —O—, —OCO—, —COO—, —NHCO— or —CONH—.

More preferably, each $R_{10}$ and $R_{20}$ represents hydrogen atom, straight or branched alkyl group comprising 1 to 10 carbon atoms, or a group: $R_{30}$—X—, wherein $R_{30}$ is a straight or branched alkyl group having 1 to 10 carbon atoms, and X is —O—, —OCO—, —COO—, —NHCO— or —CONH—.

The compound represented by the formula (I-A) includes polyoxyethylene phenyl ether, polyoxyethylene methylphenyl ether, polyoxtethylene octylphenyl ether, polyoxyethylene nonylphenyl ether and the like.

The compound represented by the formula (I-B) includes polylxyethylene naphthyl ether, polyoxyethylene methylnaphthyl ether, polyoxyethylene octylnaphthyl ether, polyoxyethylene nonylnaphthyl ether and the like.

In the compound represented by the formula (I-A) or (I-B), the number of repeating unit in a polyoxyethylene chain is preferably from 3 to 50, and more preferably from 5 to 30. The number of repeating unit in a polyoxypropylene chain is preferably from 0 to 10, and more preferably from 0 to 5. In the compound of the formula (I), a polyoxyethylene moiety and a polyoxypropylene moiety may be arrayed in the form of a random or block copolymer.

The nonionic compound of the formula (I), for example, the nonionic aromatic ether represented by the formula (I-A) or (I-B) may be used alone or in any combination of at least two of them.

According to the present invention, the amount of the nonionic compound represented by the formula (1) in the developer ranges generally from 0.1 to 15% by weight, and preferably from 1.0 to 8.0% by weight. If the amount is too small, the developing performance and ability in dissolving components of a light-sensitive layer will be degraded. If the amount is too large, printing durability of a printing plate will be degraded.

[Chelating Agent]

The developer of the present invention may comprise a chelating agent. Such chelating agent includes polyphosphates such as $Na_2P_2O_7$, $Na_5P_3O_3$, $Na_3P_3O_9$, $Na_2O_4P(NaO_3P)PO_3Na_2$ and Calgon (trade name of sodium polymetaphosphate, available from Calgon Inc, (USA)); polyaminocarboxylic acids and salts thereof such as ethylenediaminetetraacetic acid and potassium and sodium salts thereof, diethylenetriaminepentaacetic acid and potassium and sodium salts thereof, triethylenetetraminehexaacetic acid and potassium and sodium salts thereof, hydroxyethylethylenediaminetriacetic acid and potassium and sodium salts thereof, nitrilotriacetic acid and potassium and sodium salts thereof, 1,2-diaminocyclohexanetetraacetic acid and potassium and sodium salts thereof and 1,3-diamino-2-propanoltetraacetic acid and potassium and sodium salts thereof, and organophosphonic acids, potassium, sodium and ammonium salts thereof such as 2-phosphonobutane tricarboxylic acid-1,2,4 and potassium and sodium salts thereof, 2-phosphonobutanone tricarboxylic acid-2,3,4 and potassium and sodium salts thereof, 1-phosphonoethane tricarboxylic acid-1,2,2 and potassium and sodium salts thereof, 1-hydroxyethane-1,1-diphosphonic acid and potassium and sodium salts thereof and amino tri(methylene phosphonic acid) and potassium and sodium salts thereof. The optimum amount of the chelating agent varies depending on the hardness and the amount of hard water used, but the amount thereof in general ranges from 0.01 to 5% by weight and preferably 0.01 to 0.5% by weight in the developer practically used.

[Surfactant]

The developer according to the present invention may further comprise surfactants shown below, which is other than the nonionic compound represented by the formula (I).

The surfactant includes a nonionic surfactant including polyoxyethylene alkyl ethers such as polyoxyethylene lauryl ether, polyoxyethylene cetyl ether and polyoxyethylene stearyl ether; polyoxyethylene alkylaryl ethers such as polyoxyethylene octylphenyl ether and polyoxyethylene nonylphenyl ether; polyoxyethylene alkyl esters such as polyoxyethylene stearate; and sorbitan alkyl esters such as sorbitan monolaurate, sorbitan monostearate, sorbitan distearate, sorbitan monooleate, sorbitan sesquioleate and sorbitan trioleate; an anionic surfactant including alkylbenzene sulfonic acid salts such as sodium dodecylbenzenesulfonate; alkylnaphthalene sulfonic acid salts such as sodium butylnaphthalenesulfonate, sodium pentylnaphthalenesulfonate, sodium hexylnaphthalenesulfonate and sodium octylnaphthalenesulfonate; alkylsulfuric acid salts such as dodecyl sodium sulfate; alkyl sulfonic acid salts such as sodium dodecylsulfonate; and sulfosuccinate salts such as dilauryl sodium sulfosuccinate; and an amphoteric surfactant including alkylbetaines such as laurylbetaine and stearylbetaine; and amino acids type-amphoteric surfactants, and preferred among these are anionic surfactants such as alkylnaphthalene sulfonic acid salts and the like.

The surfactant may be used alone or in any combination of at least two of them. The amount of the surfactant in the developer ranges generally from 0.1 to 20% by weight in terms of the effective component thereof.

[Others]

The developer according to the present invention may further comprise as occasion demands, other components than those described above. Such components include organic carboxylic acids such as benzoic acid, phthalic acid, p-ethyl benzoic acid, p-n-propyl benzoic acid, p-isopropyl benzoic acid, p-n-butyl benzoic acid, p-t-butyl benzoic acid, p-2-hydroxyethyl benzoic acid, decanoic acid, salicylic acid, 3-hydroxy-2-naphthoic acid and the like; organic solvents such as isopropyl alcohol, benzyl alcohol, ethyl cellosolve, butyl cellosolve, phenyl cellosolve, propylene glycol, diacetone alcohol and the like; a reducing agent; a colorant dye; a pigment; a water softner; an antiseptic agent and the like.

When an automatic processor is used to perform development procedure in the plate-making method according to the present invention, the developer becomes exhausted depending on throughput amount of plates and a replenisher or flesh developer may be used to restore the throughput capacity of developer.

[Conductivity]

The developer according to the present invention has suitably a conductivity of from 3 to 30 mS/cm and preferably from 3 to 15 mS/cm in the light of a developing speed.

[Foaming Property]

Foaming property of the developer may be determined by the following procedure: 30 ml of the developer is poured into a transparent glass bottle having a volume of 100 ml and an inner diameter of 3 cm, the glass bottle is shaken up and down at a speed of 3 times per one second for one minute at a temperature of 25° C., then the glass bottle is allowed to stand so as to determine the time which is taken until the generated foam disappears (foam-disappearing time). When said time is smaller, the foaming property of the developer is lower and favorable, in other words, anti-foaming property is higher.

The developer of the present invention has preferably the lower foaming property and a foam-disappearing time of not more than 5 minutes which is determined by the above procedure. Thus the developer of the present invention does not cause an obstacle due to foaming during development processing procedure.

[Color]

The developer of the present invention may be colorless or preferably as colored as visually recognized so as to avoid a false recognition between the developer and water.

[Viscosity]

The developer of the present invention has generally a viscosity of from 1.0 to 10.0 cp in the form of diluted solution at a temperature of 25° C. so that development processing procedure can be smoothly performed.

EXAMPLES

The present invention will be explained in more detail with reference to the following non-limitative working Examples and the effects practically attained by the present invention will also be discussed in detail in comparison with Comparative Examples.

[Preparation of Substrates]

[Preparation of Substrate No. 1: Anodized Aluminum Substrate]

An aluminum plate (grade 1S) having a thickness of 0.30 mm was surface-grained with a nylon brush (No. 8) and an aqueous suspension of 800-mesh pumice stone and then sufficiently washed with water. Then the aluminum plate was etched by immersing in a 10% aqueous solution of sodium hydroxide at 70° C. for 60 seconds, followed by successively washing with running water, a 20% nitric acid solution for neutralization, and water. The surface of the aluminum plate was then electrolytically roughened in a 1% aqueous solution of nitric acid by the application of an alternating current in the form of a sinusoidal wave at the applied voltage (Va) of 12.7 V. The electrical charge was set to 300 C/dm$^2$ at the anode side. At this stage, the surface roughness of the aluminum plate was measured and found to be 0.45 μm in terms of Ra unit. Subsequently, the aluminum plate was immersed in a 30% aqueous solution of sulfuric acid at 55° C. for 2 minutes to desmut from the plate. The aluminum plate was then anodized in a 20% aqueous solution of sulfuric acid at 33° C. for 50 seconds at a current density of 5 A/dm$^2$, with the surface-grained surface of the aluminum plate serving as a cathode. The result was that the anodized layer with a thickness of 2.7 g/m$^2$ was deposited on the anode. The aluminum plate thus prepared was used as a substrate No. 1.

[Preparation of Substrate No. 2]

A liquid composition for undercoating layer No. 1 with the following formulation was coated on the substrate No. 1 for surface treatment so that the amount of phosphorus (P) in the coated layer was about 0.05 g/m$^2$. The coated layer was dried at 100° C. for one minute, so that a substrate No. 2 was obtained.

<Liquid Composition for Undercoating Layer No. 1>

|  | Parts by Weight |
|---|---|
| Phenylphosphonic acid | 2 |
| Methanol | 800 |
| Water | 50 |

[Preparation of Substrate No. 3]

The liquid composition for undercoating layer No. 2 thus prepared was coated on the substrate No. 1 for surface treatment so that the amount of silicon (Si) in the coated layer was about 0.001 g/m². The coated layer was dried at 100° C. for one minute, so that a substrate No. 3 was obtained.

<Liquid Composition for Undercoating Layer No. 2>

A mixture of the following components was stirred. About five minutes later, an exothermic reaction was found. After the reaction was carried out for 60 minutes, the reaction product was put into another container, and 30,000 parts by weight of methanol were further added to the reaction product. Thus, a liquid composition for undercoating layer No. 2 was prepared.

|  | Parts by Weight |
|---|---|
| "Phosmer PE" (trademark), made by Uni-Chemical Co., Ltd. | 20 |
| Methanol | 130 |
| Water | 20 |
| p-Toluenesulfonic acid | 5 |
| Tetraethoxysilane | 50 |
| 3-Methacryloxy propyl triethoxysilane | 50 |

[Formation of Light-Sensitive Layer]

The following components were mixed to prepare a coating liquid for formation of a light-sensitive layer.

Each coating liquid for the light-sensitive layer was coated on the substrate described above so that the coating amount was 1.5 g/m² on a dry basis and dried at 100° C. for one minute, whereby a light-sensitive layer was provided on the substrate.

Subsequently, a 3% aqueous solution of polyvinyl alcohol with a degree of saponification of 98 mol % and a degree of polymerization of 500 was coated on the light-sensitive layer so that the coating amount was 2.5 g/m² on a dry basis and dried at 120° C. for 3 minutes. Thus, PS plates No. 1 to No. 9 were obtained.

<Formulation for Coating Liquid for Light-Sensitive Layer>

|  | Parts by Weight |
|---|---|
| Ethylenically unsaturated bond-containing compound (A) | a(*) |
| Polyurethane resin binder (B) | b(*) |
| Sensitizer (C) | 0.15 |
| Photopolymerization initiator (D) | 0.30 |
| Additive (S) | 0.50 |
| Fluorine-containing surfactant ("Megafac F-177" (trademark), made by Dainippon Ink & Chemicals, Incorporated) | 0.03 |
| Thermal polymerization inhibitor (N-nitrosohydroxylamine aluminum salt) | 0.01 |
| ε-type copper phthalocyanine dispersion | 0.2 |
| Methyl ethyl ketone | 30.0 |
| Propylene glycol monomethyl ether | 30.0 |

(*) The amounts (a) and (b) are shown in Table 4.

Specific examples of the above-mentioned ethylenically unsaturated bond-containing compound (A), polyurethane resin binder (B), sensitizer (C), photopolymerization initiator (D), and additive (S) used are shown below:

TABLE 4

|  | PS plates | A (a parts by weight) | B (b parts by weight) | C | D | S | Substrate | Acid value* in the light-sensitive layer (meq/g) |
|---|---|---|---|---|---|---|---|---|
| Examples | 1 | A-1 (1.9) | B-1 (1.7) | C-1 | D-1 | S-1 | 1 | 0.16 |
|  | 2 | A-1 (1.9) | B-2 (1.7) | C-1 | D-1 | S-1 | 2 | 0.33 |
|  | 3 | A-1 (1.5) | B-3 (2.0) | C-1 | D-1 | S-1 | 3 | 0.40 |
|  | 4 | A-2 (2.3) | B-4 (2.0) | C-1 | D-1 | S-1 | 3 | 0.24 |
|  | 5 | A-1 (1.9) | B-5 (1.7) | C-1 | D-2 | S-1 | 2 | 0.63 |
|  | 6 | A-2 (1.9) | B-6 (1.7) | C-2 | D-3 | S-3 | 1 | 0.35 |
|  | 7 | A-1 (1.9) | B-7 (1.7) | C-3 | D-4 | S-1 | 2 | 0.08 |
|  | 8 | A-3 (1.9) | B-8 (1.7) | C-4 | D-4 | S-2 | 2 | 0.17 |
|  | 9 | A-1 (1.9) | B-9 (1.7) | C-4 | D-4 | S-1 | 2 | 0.20 |
|  | 10 | A-2 (2.3) | B-10 (2.0) | C-1 | D-1 | S-1 | 2 | 0.23 |
|  | 11 | A-1 (1.7) | B-4 (1.9) | C-1 | D-1 | S-1 | 1 | 0.25 |
|  | 12 | A-2 (2.3) | B-4 (2.0) | C-1 | D-1 | S-1 | 2 | 0.24 |
|  | 13 | A-4 (1.7) | B-4 (1.9) | C-4 | D-1 | S-3 | 3 | 0.26 |
|  | 14 | A-3 (1.7) | B-1 (1.7) | C-3 | D-3 | S-2 | 2 | 0.16 |
|  | 15 | A-2 (2.2) | B-3 (2.0) | C-2 | D-1 | S-3 | 1 | 0.25 |
|  | 16 | A-2 (1.7) | B-9 (2.0) | C-4 | D-2 | S-1 | 2 | 0.22 |
|  | 17 | A-3 (1.7) | B-5 (1.9) | C-3 | D-1 | S-2 | 3 | 0.70 |
|  | 18 | A-2 (1.8) | B-4 (1.6) | C-3 | D-4 | S-2 | 1 | 0.22 |
| Comp. Ex. | 1 | A-1 (1.7) | B-11 (1.9) | C-1 | D-2 | S-1 | 2 | 0.45 |
|  | 2 | A-2 (1.7) | B-12 (1.9) | C-4 | D-1 | S-2 | 1 | 0.42 |

*The acid value of the light-sensitive layer is experimentally obtained by titration using an aqueous solution of sodium hydroxide.

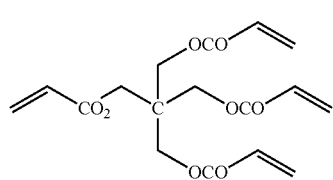
(A-1)
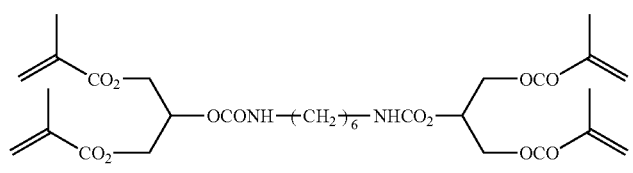
(A-2)
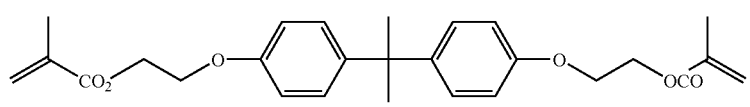
(A-3)
(50 wt %)
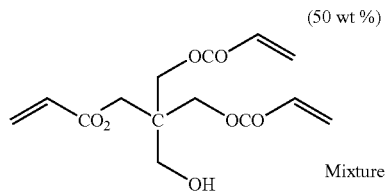
Mixture
(50 wt %)
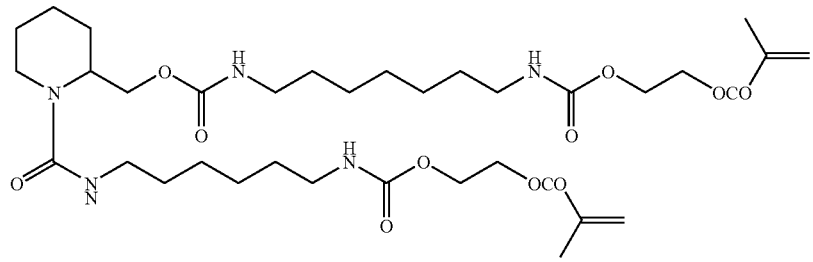
(A-4)
(50 wt %)
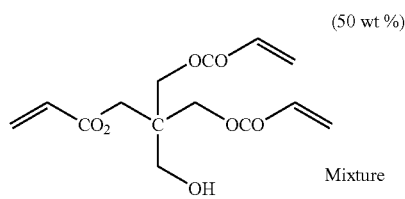
Mixture
(50 wt %)
TABLE 5
| Polyurethane resin binder | The number of polyurethane resin compound described in the specification | Weight average molecular weight (by GPC method, calibrated with polystyrene) |
| --- | --- | --- |
| (B-1) | (1) | 41,000 |
| (B-2) | (4) | 78,000 |
| (B-3) | (6) | 55,000 |
| (B-4) | (7) | 61,000 |
| (B-5) | (9) | 205,000 |
| (B-6) | (11) | 110,000 |
| (B-7) | (12) | 9,000 |
| (B-8) | (13) | 32,000 |
| (B-9) | (18) | 48,000 |
| (B-10) | (19) | 77,000 |

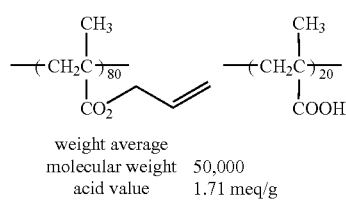
(B-11)
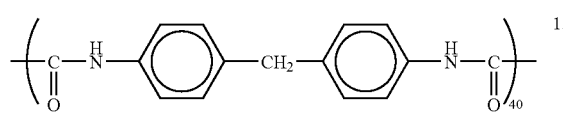
(B-12)
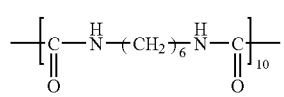
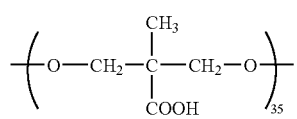
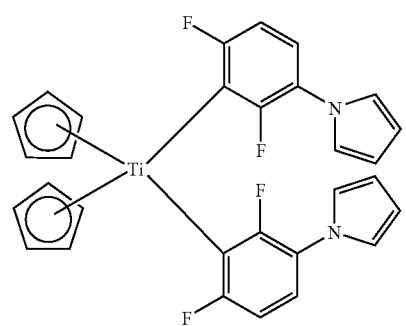
(C-1)
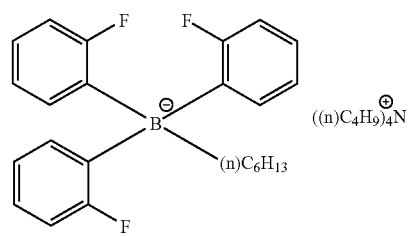
(C-2)
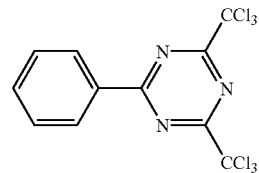
(C-3)
-continued
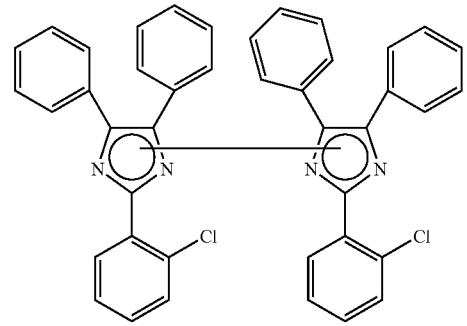
(C-4)
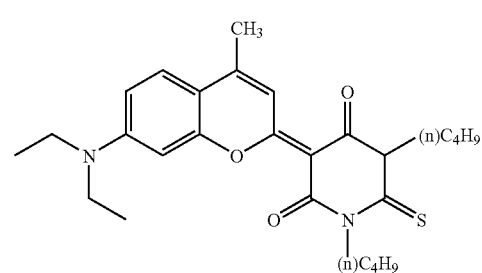
(D-1)
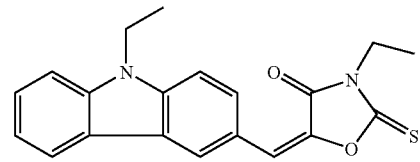
(D-2)
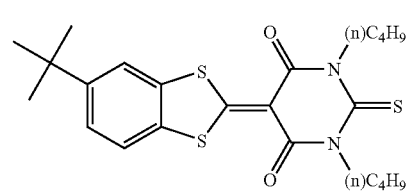
(D-3)
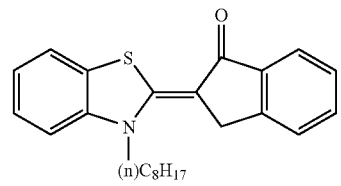
(D-4)
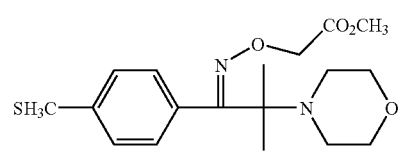
(S-1)
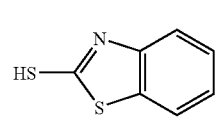
(S-2)
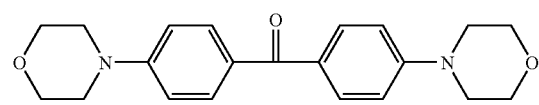
(S-3)

[Preparation of Developers]

Developers No. 1 to No. 35, and Comparative Developers No. 1' to 5' each having the following composition were prepared (see tables 6 to 8).

| | |
|---|---|
| Alkaline agent | x g (*) |
| Alkali silicate | y g (*) |
| Compound (Y) represented by formula (I) | 5.0 g |
| Chelating agent (Z) | 0.1 g |

-continued

| | |
|---|---|
| Additive (Q) | 1.0 g |
| Water | (93.9−(x + y)) g |

(*) The amounts (x) and (y) are shown in Tables 6 to 8.

Specific examples of the above-mentioned chelating agent (Z) and additive (Q) used are shown below:

Tables 6 to 8 shows the compositions of the developers employed in Examples and Comparative Examples, and the pH values of the resultant developers, and the conductivity thereof which was measured at 25° C. using a commercially available conductivity meter "CM60S" (trademark) made by Toa Denpa Kogyo Corporation.

TABLE 6

| | Alkali agent | x (g) | Alkali silicate | y (g) | SiO$_2$/M$_2$O (molar ratio) | Y | Z | Q | pH (25° C.) | Conductivity (mS/cm) |
|---|---|---|---|---|---|---|---|---|---|---|
| Developer 1 | NaOH | 0.15 | 1K potassium silicate | 2.4 | 2.0 | Y-1 | Z-1 | — | 12 | 14 |
| Developer 2 | KOH | 0 | 1K potassium silicate | 2.4 | 2.0 | Y-1 | Z-1 | — | 11.6 | 6 |
| Developer 3 | KOH | 0.2 | 1K potassium silicate | 2.4 | 1.9 | Y-1 | Z-1 | — | 12 | 14 |
| Developer 4 | KOH | 0.4 | 1K potassium silicate | 2.4 | 1.8 | Y-1 | Z-1 | — | 12.2 | 15 |
| Developer 5 | KOH | 0.8 | 1K potassium silicate | 2.4 | 1.6 | Y-1 | Z-1 | — | 12.5 | 19 |
| Developer 6 | KOH | 0.05 | 2K potassium silicate | 1 | 3.4 | Y-1 | Z-1 | — | 11.7 | 7 |
| Developer 7 | KOH | 0.05 | A potassium silicate | 3 | 3.0 | Y-1 | Z-1 | — | 11.7 | 7 |
| Developer 8 | KOH | 0.05 | Sodium silicate No. 3 | 4 | 3.0 | Y-1 | Z-1 | — | 11.8 | 7 |
| Developer 9 | KOH | 0.2 | 1K potassium silicate | 2.4 | 1.9 | Y-1 | なし | — | 12 | 14 |
| Developer 10 | KOH | 0.2 | 1K potassium silicate | 2.4 | 1.9 | Y-4 | Z-1 | — | 12 | 14 |
| Developer 11 | KOH | 0.2 | 1K potassium silicate | 2.4 | 1.9 | Y-6 | Z-1 | — | 12 | 14 |
| Developer 12 | KOH | 0.2 | 1K potassium silicate | 2.4 | 1.9 | Y-10 | Z-2 | — | 12 | 14 |
| Developer 13 | KOH | 0.2 | 1K potassium silicate | 2.4 | 1.9 | Y-13 | Z-3 | Q-6 | 12 | 14 |
| Developer 14 | KOH | 0.2 | 1K potassium silicate | 2.4 | 1.9 | Y-17 | Z-1 | — | 12 | 14 |
| Developer 15 | KOH | 0.2 | 1K potassium silicate | 2.4 | 1.9 | Y-21 | Z-1 | — | 12 | 14 |
| Developer 16 | KOH | 0.2 | 1K potassium silicate | 2.4 | 1.9 | Y-1 | Z-1 | Q-1 | 12 | 14 |
| Developer 17 | KOH | 0.2 | 1K potassium silicate | 2.4 | 1.9 | Y-1 | Z-1 | Q-2 | 12 | 14 |
| Developer 18 | KOH | 0.2 | 1K potassium silicate | 2.4 | 1.9 | Y-1 | Z-1 | Q-3 | 12 | 14 |

TABLE 7

| | Alkali agent | x (g) | Alkali silicate | y (g) | SiO$_2$/M$_2$O (molar ratio) | Y | Z | Q | pH (25° C.) | Conductivity (mS/cm) |
|---|---|---|---|---|---|---|---|---|---|---|
| Developer 19 | KOH monoethanolamine | 0.2 1.35 | 1K potassium silicate | 2.4 | 1.9 | Y-1 | Z-1 | — | 12 | 14 |
| Developer 20 | NaOH Na$_2$CO$_3$ | 0.15 0.16 | 1K potassium silicate | 2.4 | 2.0 | Y-1 | Z-1 | — | 12 | 16 |
| Developer 21 | KOH K$_2$CO$_3$ | 0 0.16 | 1K potassium silicate | 2.4 | 2.0 | Y-1 | Z-1 | — | 11.6 | 8 |
| Developer 22 | KOH K$_2$CO$_3$ | 0.2 0.16 | 1K potassium silicate | 2.4 | 1.9 | Y-1 | Z-1 | Q-4 | 12 | 16 |
| Developer 23 | KOH K$_2$CO$_3$ | 0.4 0.16 | 1K potassium silicate | 2.4 | 1.8 | Y-1 | Z-1 | — | 12.2 | 17 |
| Developer 24 | KOH K$_2$CO$_3$ | 0.4 0.16 | 1K potassium silicate | 2.4 | 1.8 | Y-1 | Z-1 | — | 12.2 | 17 |
| Developer 25 | KOH K$_2$CO$_3$ | 0.8 0.16 | 1K potassium silicate | 2.4 | 1.6 | Y-1 | Z-1 | Q-5 | 12.5 | 21 |
| Developer 26 | KOH K$_2$CO$_3$ | 0.05 0.16 | 2K potassium silicate | 1 | 3.4 | Y-1 | Z-1 | — | 11.7 | 9 |
| Developer 27 | KOH K$_2$CO$_3$ | 0.05 0.16 | A potassium silicate | 3 | 3.0 | Y-1 | Z-1 | — | 11.7 | 9 |
| Developer 28 | KOH K$_2$CO$_3$ | 0.05 0.16 | Sodium silicate No. 3 | 4 | 3.0 | Y-1 | Z-1 | Q-7 | 11.8 | 9 |
| Developer 29 | KOH | 0.15 | — | — | — | Y-1 | Z-1 | なし | 11.5 | 5 |

TABLE 8

| | Alkali agent | x (g) | Alkali silicate | y (g) | SiO$_2$/M$_2$O (molar ratio) | Y | Z | Q | pH (25° C.) | Conductivity (mS/cm) |
|---|---|---|---|---|---|---|---|---|---|---|
| Developer 30 | KOH | 0.2 | — | — | — | Y-1 | Z-1 | — | 12.3 | 8 |
| Developer 31 | KOH | 0.15 | — | — | — | Y-6 | — | — | 11.8 | 4 |
| Developer 32 | KOH | 0.2 | — | — | — | Y-10 | Z-2 | — | 12 | 7 |
| Developer 33 | KOH | 0.2 | — | — | — | Y-13 | Z-3 | — | 12 | 7 |
| Developer 34 | KOH tri-ethanolamine | 0.15 1.35 | — | — | — | Y-17 | Z-1 | Q-6 | 12 | 6 |
| Developer 35 | KOH K$_2$CO$_3$ | 0.2 0.16 | — | — | — | Y-21 | Z-1 | Q-7 | 12 | 8 |
| Developer 1' | KOH | 0 | 2K potassium silicate | 1 | 3.5 | Y-1 | Z-1 | — | 10.5 | 5 |
| Developer 2' | KOH | 2.0 | — | — | — | Y-1 | Z-1 | — | 13 | 5 |
| Developer 3' | KOH | 0.2 | 1K potassium silicate | 1 | 3.5 | — | Z-1 | — | 12 | 14 |
| Developer 4' | A developer "DV-1" available from Fuji Photo Film Co., Ltd. was diluted ten times with water. | | | | | | | | 12.9 | 35 |
| Developer 5' | An organic alkaline developer "DN3C" available from Fuji Photo Film Co., Ltd. was diluted twice with water. | | | | | | | | 10 | 8 |

In the above, "1K potassium silicate", "2K potassium silicate", "A potassium silicate" and "sodium silicate No. 3" are trade names of the products manufactured by Nippon Chemical Industrial Co., Ltd. The comparative developers No. 4 and No. 5 don't contain any nonionic compounds represented by formula (1).

[Evaluation Tests]

In each of Examples 1 to 52 and Comparative Examples 1 to 5, a PS plate selected from Table 4 and a developer from Tables 6 to 8 were employed in combination. The combination of the PS plate and the developer is shown in the following Tables 9 and 10. The PS plates were subjected to light exposure and development under the following conditions to conduct evaluation tests. The evaluation tests were carried out as follows.

(1) Evaluation of Development Performance

Each PS plate was not subjected to light exposure before development. After completion of the development, the color of the obtained printing plate was visually inspected. The color of the light-sensitive layer was recognized when there remained the residue. The results are shown in Tables 9 and 10.

(2) Evaluation of Printing Durability and Scumming After Intermission

Two types of light sources were employed for light exposure of the PS plates. FD•YAG laser ("PlateJet 4" (trademark), made by Cymbolic Sciences, Inc.) with a wavelength of 532 nm and an intensity of 100 mW and violet LD with a wavelength of 405 nm and an intensity of 30 mW emitting from a laboratory-scale internal drum exposure unit were used. With an exposure of 100 μ/cm$^2$ under the standard exposure conditions, a solid image and dot images (with an increased dot percent from 1 to 99% by 1%) were subjected to scanning using the above-mentioned light sources at a density of 4000 dpi and 175 rays/inch.

After completion of the light exposure, each PS plate was subjected to development under the standard conditions using a commercially available automatic processor ("LP-850P2" (trade name), made by Fuji Photo Film Co., Ltd.) equipped with the developer as designated in Tables 6 to 8 and a finishing gum ("FP-2W" (trade name), made by Fuji Photo Film Co., Ltd.), whereby a lithographic printing plate was obtained. Each PS plate was pre-heated after light exposure so that the surface temperature of the plate reached 100° C., and the plate was immersed in the developer for 15 seconds.

With the obtained printing plate set on a lithographic press "R201" (trade name), made by MAN Roland, printing operation was carried out using a printing ink ("GEOS G black (N)" (trade name), made by Dainippon Ink & Chemicals, Incorporated). To evaluate the printing durability, occurrence of dot loss on the dot image with a dot percent of 3% was examined. The printing durability was expressed by the maximum number of printed sheets before the occurrence of dot loss. The results are shown in Tables 9 and 10.

Scumming after intermission was examined by the following method. The obtained PS plate was set on a lithographic press "DAIYA IF2" (trade name), made by Mitsubishi Heavy Industries, Ltd., which was equipped with a printing ink ("GEOS G magenta (S)" (trade name), made by Dainippon Ink & Chemicals, Incorporated) to start printing operation. The printing operation was stopped and the press was allowed to stand for one hour with the printing ink being attached to the printing plate. When the press was started again one hour later, the presence of scumming on non-image areas for printed matter was visually checked. The results are shown in Tables 9 and 10.

(3) Evaluation of Sludge in Developer

After completion of the development of the above-mentioned printing plate (20 m$^2$) using the correspondent developer (1 litter), the developer was allowed to stand for one month. The presence of any sludge in the developer was inspected. The results are also shown in Tables 9 and 10.

TABLE 9

| | PS Plate No. | Developer No. | Development Performance (*) | Scumming after Intermission () | Printing Durability (No. of Sheets) | Sludge in Developer (*) |
|---|---|---|---|---|---|---|
| Ex. 1 | 8 | 3 | None | None | 250,000 | None |
| Ex. 2 | 9 | 3 | None | None | 200,000 | None |
| Ex. 3 | 10 | 3 | None | None | 250,000 | None |
| Ex. 4 | 11 | 3 | None | None | 200,000 | None |
| Ex. 5 | 12 | 3 | None | None | 200,000 | None |
| Ex. 6 | 13 | 23 | None | None | 250,000 | None |
| Ex. 7 | 14 | 23 | None | None | 200,000 | None |
| Ex. 8 | 16 | 23 | None | None | 150,000 | None |

TABLE 9-continued

| | PS Plate No. | Developer No. | Development Performance (*) | Scumming after Inter-Mission () | Printing Durability (No. of Sheets) | Sludge in Developer (*) |
|---|---|---|---|---|---|---|
| Ex. 9 | 18 | 1 | None | None | 250,000 | None |
| Ex. 10 | 10 | 2 | None | None | 250,000 | None |
| Ex. 11 | 1 | 3 | None | None | 250,000 | None |
| Ex. 12 | 2 | 4 | None | None | 200,000 | None |
| Ex. 13 | 3 | 5 | None | None | 200,000 | None |
| Ex. 14 | 4 | 6 | None | None | 250,000 | None |
| Ex. 15 | 5 | 7 | None | None | 250,000 | None |
| Ex. 16 | 6 | 8 | None | None | 250,000 | None |
| Ex. 17 | 7 | 9 | None | None | 200,000 | None |
| Ex. 18 | 8 | 10 | None | None | 250,000 | None |
| Ex. 19 | 9 | 11 | None | None | 250,000 | None |
| Ex. 20 | 10 | 12 | None | None | 250,000 | None |
| Ex. 21 | 11 | 13 | None | None | 200,000 | None |
| Ex. 22 | 12 | 14 | None | None | 250,000 | None |
| Ex. 23 | 13 | 15 | None | None | 250,000 | None |
| Ex. 24 | 14 | 16 | None | None | 250,000 | None |
| Ex. 25 | 15 | 17 | None | None | 250,000 | None |
| Ex. 26 | 16 | 18 | None | None | 200,000 | None |
| Ex. 27 | 17 | 19 | None | None | 250,000 | None |
| Ex. 28 | 18 | 20 | None | None | 250,000 | None |
| Ex. 29 | 9 | 21 | None | None | 200,000 | None |
| Ex. 30 | 10 | 22 | None | None | 200,000 | None |
| Ex. 31 | 11 | 24 | None | None | 250,000 | None |
| Ex. 32 | 12 | 25 | None | None | 250,000 | None |
| Ex. 33 | 13 | 26 | None | None | 150,000 | None |
| Ex. 34 | 18 | 27 | None | None | 200,000 | None |
| Ex. 35 | 1 | 28 | None | None | 200,000 | None |

TABLE 10

| Examples | PS Plate No. | Developer No. | Development Performance(*) | Scumming after Inter-Mission () | Printing Durability (No. of Sheets) | Sludge in Developer (*) |
|---|---|---|---|---|---|---|
| Ex. 36 | 2 | 29 | None | None | 150,000 | None |
| Ex. 37 | 3 | 29 | None | None | 250,000 | None |
| Ex. 38 | 4 | 29 | None | None | 250,000 | None |
| Ex. 39 | 5 | 30 | None | None | 250,000 | None |
| Ex. 40 | 6 | 30 | None | None | 250,000 | None |
| Ex. 41 | 7 | 30 | None | None | 150,000 | None |
| Ex. 42 | 8 | 30 | None | None | 200,000 | None |
| Ex. 43 | 9 | 31 | None | None | 250,000 | None |
| Ex. 44 | 10 | 31 | None | None | 250,000 | None |
| Ex. 45 | 11 | 32 | None | None | 200,000 | None |
| Ex. 46 | 12 | 32 | None | None | 200,000 | None |
| Ex. 47 | 13 | 33 | None | None | 250,000 | None |
| Ex. 48 | 14 | 33 | None | None | 250,000 | None |
| Ex. 49 | 15 | 34 | None | None | 200,000 | None |
| Ex. 50 | 16 | 34 | None | None | 200,000 | None |
| Ex. 51 | 17 | 35 | None | None | 250,000 | None |
| Ex. 52 | 18 | 35 | None | None | 250,000 | None |
| Comp. Ex. 1 | Comp. PS PlateNo. 1 | 3 | Observed | Observed | 250,000 | None |
| Comp. Ex. 2 | Comp. PS PlateNo. 2 | 29 | Observed | Observed | 200,000 | None |
| Comp. Ex. 3 | 9 | 1' | Observed | Observed | 250,000 | Observed |
| Comp. Ex. 4 | 9 | 2' | Observed | Observed | 100,000 | None |
| Comp. Ex. 5 | 9 | 3' | Observed | Observed | 50,000 | Observed |
| Comp. Ex. 6 | 9 | 4' | None | None | 30,000 | Observed |
| Comp. Ex. 7 | 9 | 5' | None | None | 30,000 | Observed |

(*) "None" means there remained no light-sensitive layer, i.e., no residue, while "Observed" means there remained the light-sensitive layer, i.e., residue.
(**) "None" means there was no ink contamination on non-image areas for printed matter after the printing operation was started again after intermission; while "Observed" means ink contamination was observed on non-image areas.
(***) "None" means there was no sludge in the developer; while "Observed" means there was sludge in the developer.

✻PS plate Nos. 5 to 9, 14, 16, 18 and Comparative PS plate No. 1 were exposed at 405 nm and the others were exposed at 532 nm.

As is apparent from Tables 9 and 10, the developers according to the present invention exhibit excellent development performance and impart favorable printing durability to a printing plate, without scumming of the non-image areas even after intermission. Further, the developers of the present invention produce no sludge in the developer over a long period of time, thereby exhibiting stable running performance.

(4) Evaluation of Development Behavior

In accordance with the inspection methods as mentioned above, the development behavior was examined in Example 53 and Comparative Examples 1 to 5. The results are shown in Table 11.

TABLE 11

| | PS plate No. | Developer No. | Rate of Developing Non-exposed area (μm/s) | Rate of Developer-Penetration into Exposed area (μm/s) | Dissolving Behavior (presence/absence of interference wave) |
|---|---|---|---|---|---|
| Ex.53 | 12 | 3 | 0.2 | 0.005 | Present |
| Comp. Ex. 8 | 12 | 1' (Comp.) | 0.005 | 0.005 | Absent |
| Comp. Ex. 9 | 12 | 2' (Comp.) | 0.005 | 0.005 | Absent |

TABLE 11-continued

| PS plate No. | Developer No. | Rate of Developing Non-exposed area (µm/s) | Rate of Developer-Penetration into Exposed area (µm/s) | Dissolving Behavior (presence/absence of interference wave) |
|---|---|---|---|---|
| Comp. Ex. 10 | 12 | 3' (Comp.) | 0.01 | 0.15 | Absent |
| Comp. Ex. 11 | 12 | 4' (Comp.) | 0.01 | 0.15 | Absent |
| Comp. Ex. 12 | 12 | 5' (Comp.) | 0.05 | 0.2 | Absent |

The developers for PS plates and the method for making the printing plate using the above-mentioned developers according to the present invention are advantageous in that scumming during printing can be prevented and the printing durability can be improved without impairing the image formation performance on the PS plates. The compounds not soluble in the developers used hitherto can be dissolved or dispersed stably in the developers of the present invention for a long period of time, so that the running performance of the developer can be excellent and stabilized.

What is claimed is:

1. A presensitized plate for making a lithographic printing plate, which comprises an aluminum substrate provided thereon with a light-sensitive layer comprising a polyurethane resin binder, an addition polymerizable ethylenically unsaturated bond-containing compound and a photopolymerization initiator, wherein the polyurethane resin binder is one synthesized from at least the following compounds (i), (ii), (iii) and (iv):
   (i) at least one di-isocyanate compound;
   (ii) at least one diol compound having at least one carboxyl group;
   (iii) at least one diol compound whose logP value ranges from −8 to −1, wherein said logP value is defined as a logarithmic value of a balanced concentration ratio P calculated from a proportion of a partition between an octanol layer and a water layer; and
   (iv) at least one diol compound whose logP value ranges from 1 to 20, provided that the compounds (iii) and (iv) do not include diol compounds each having a carboxyl group,
   wherein the (iii) diol compound whose logP value ranges from −8 to −1 is selected from the compounds represented by Formula (A'):

   HO—(CH$_2$CH$_2$O)$_n$—H          (A')

wherein n is an integer of not less than 1.

2. The presensitized plate of claim 1, wherein the (iv) diol compound whose log P value ranges from 1 to 20 is a polypropylene glycol represented by Formula (A):

   HO—(CH$_2$CH(R$_6$)—O)$_a$—H          (A)

wherein R$_6$ is a methyl group and a ranges from 5 to 50.

3. The presensitized plate of claim 1, wherein the acid value of the polyurethane resin binder is in the range of from 0.2 to 4.0 meq/g.

4. The presensitized plate of claim 1, wherein the acid value of the polyurethane resin binder is in the range of from 0.6 to 1.2 meq/g and the polyurethane resin binder is one synthesized from at least the following compounds (i), (ii), (iii) and (iv):
   (i) at least two di-isocyanate compounds or a combination of at least one aliphatic di-isocyanate compound and at least one aromatic di-isocyanate compound,
   (ii) at least one diol compound having a carboxyl group represented by the general formula (2);

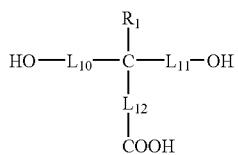

$$HO-L_{10}-\underset{\underset{COOH}{\overset{\overset{R_1}{|}}{L_{12}}}}{\overset{|}{C}}-L_{11}-OH \qquad (2)$$

wherein R$_1$ represents a hydrogen atom or an alkyl, aralkyl, aryl, alkoxy or aryloxy group, which may have a substituent, and L$_{10}$, L$_{11}$, and L$_{12}$ may be the same or different and each represents a single bond or a divalent aliphatic or aromatic hydrocarbon group, which may have a substituent,
   (iii) at least one diol compound whose log P value ranges from −5 to −1.2, and
   (iv) at least one diol compound whose log P value ranges from 3 to 10.

5. A method for making a lithographic printing plate comprising the steps of imagewise exposing the presensitized plate for making a lithographic printing plate as set forth in claim 1 to a laser beam and then developing the imagewise exposed presensitized plate with a developer, which comprises a nonionic compound represented by the following general formula (I) and which has a pH value ranging from 11.5 to 12.8 and an electrical conductivity ranging from 3 to 30 mS/cm:

A-W          (I)

wherein A represents a hydrophobic organic group derived from A-H whose log P is not less than 1.5 and W represents a nonionic hydrophilic organic group derived from W-H whose log P is less than 1.0.

6. The method of claim 5, wherein the (iii) diol compound whose log P value ranges from −8 to −1 is selected from the compounds represented by Formula (A'):

   HO—(CH$_2$CH$_2$O)$_n$—H          (A')

wherein n is an integer of not less than 1.

7. The method of claim 5, wherein the (iv) diol compound whose log P value ranges from 1 to 20 is a polypropylene gycol represented by the general formula (A):

   HO—(CH$_2$CH(R$_6$)—O)$_a$—H          (A)

wherein R$_6$ is a methyl group and a ranges from 5 to 50.

8. The method of claim 5, wherein the acid value of polyurethane resin binder is in the range of from 0.2 to 4.0 meq/g.

9. The method of claim 5, wherein the acid value of polyurethane resin binder is in the range of from 0.6 to 1.2 meq/g and the polyurethane resin binder is one synthesized from at least the following compounds (i), (ii), (iii) and (iv):
   (i) at least two di-isocyanate compounds or a combination of at least one aliphatic di-isocyanate compound and at least one aromatic di-isocyanate compound,
   (ii) at least one diol compound represented by the general formula (2) and having a carboxyl group,

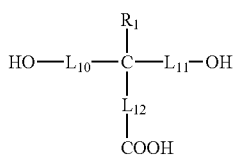

wherein $R_1$ represents a hydrogen atom or an alkyl, aralkyl, aryl, alkoxy or aryloxy group, which may have a substituent, and $L_{10}$, $L_{11}$ and $L_{12}$ may be the same or different and each represents a single bond or a divalent aliphatic or aromatic hydrocarbon group, which may have a subsituent, (iii) at least one compound whose log P value ranges from −5 to −1.2, and (iv) at least one diol compound whose log P value ranges from 3 to 10.

10. The method of claim 5, wherein the nonionic compound represented by the general formula (I) is at least one member selected from the group consisting of nonionic aromatic ether type active compounds represented by the following formulas (I-A) and (I-B):

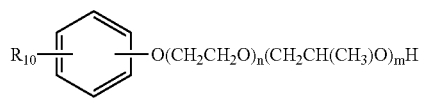

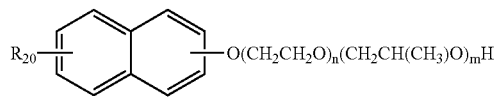

wherein $R_{10}$ and $R_{20}$ each represents H or a hydrocarbon group having 1 to 100 carbon atoms and n and m each represents an integer ranging from 0 to 100, provided that n and m do not simultaneously represent 0.

11. The method of claim 5, wherein the developer comprises an alkali silicate in an amount ranging from 0.75 to 4.0 as expressed in terms of the molar ratio: $SiO_2/M_2O$ wherein M represents an alkali metal or ammonium residue.

12. The method of claim 5, wherein the development is carried out in such a maimer that the rate of the development of an unexposed area is not less than 0.05 μm/s and the rate of the developer penetrating into the exposed area is not more than 0.1 μm/s.

13. A presensitized plate for making a lithographic printing plate, which comprises an aluminum substrate provided thereon with a light-sensitive layer comprising a polyurethane resin binder, an addition polymerizable ethylenically unsaturated bond-containing compound and a photopolymerization initiator, wherein the polyurethane resin binder is one synthesized from at least the following compounds (i), (ii), (iii) and (iv):

(i) at least one di-isocyanate compound;

(ii) at least one diol compound having at least one carboxyl group;

(iii) at least one diol compound whose log P value ranges from −8 to −1, wherein said log P value is defined as a logarithmic value of a balanced concentration ratio P calculated from a proportion of a partition between an octanol layer and a water layer; and (iv) at least one diol compound whose log P value ranges from 1 to 20, provided that the compounds (iii) and (iv) do not include diol compounds each having a carboxyl group.

* * * * *